United States Patent
George et al.

(10) Patent No.: US 7,232,767 B2
(45) Date of Patent: Jun. 19, 2007

(54) SLOTTED ELECTROSTATIC SHIELD MODIFICATION FOR IMPROVED ETCH AND CVD PROCESS UNIFORMITY

(75) Inventors: Rene George, San Jose, CA (US); Andreas Kadavanich, Fremont, CA (US); Daniel J. Devine, Los Gatos, CA (US); Stephen E. Savas, San Jose, CA (US); John Zajac, San Jose, CA (US); Hongching Shan, Cupertino, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 10/803,453

(22) Filed: Mar. 18, 2004

(65) Prior Publication Data

US 2004/0244691 A1    Dec. 9, 2004

Related U.S. Application Data

(60) Provisional application No. 60/459,405, filed on Apr. 1, 2003.

(51) Int. Cl.
*H01L 21/302* (2006.01)

(52) U.S. Cl. .......... 438/714; 257/E21.17; 257/E21.218

(58) Field of Classification Search ............... 438/710, 438/714, 795; 118/723 R, 723 I; 156/345
See application file for complete search history.

(56) References Cited

U.S. PATENT DOCUMENTS

| | | |
|---|---|---|
| 3,715,625 A | 2/1973 | Ehlers |
| 4,252,608 A | 2/1981 | Baldwin et al. |
| 4,358,686 A | 11/1982 | Kinoshita |
| 4,362,632 A | 12/1982 | Jacob |
| 4,431,898 A | 2/1984 | Reinberg et al. |
| 4,450,787 A | 5/1984 | Weakliem et al. |
| 4,739,169 A | 4/1988 | Kurosawa et al. |
| 4,844,775 A | 7/1989 | Keeble |
| 4,918,031 A | 4/1990 | Flamm et al. |

(Continued)

OTHER PUBLICATIONS

Cicala et al., "Effect of Modulation on the Plasma Deposition of Hydrogenated and Fluorinated Silicon Nitride," 1990, Plasma-surface Interactions and Processing of Materials, pp. 171-173, NATO ASI Series E: Applied Sciences, vol. 176, Kluwer Academic Publishers, the Netherlands.

(Continued)

*Primary Examiner*—Alexander Ghyka
(74) *Attorney, Agent, or Firm*—Pritzkau Patent Group LLC

(57) ABSTRACT

A more uniform plasma process is implemented for treating a treatment object using an inductively coupled plasma source which produces an asymmetric plasma density pattern at the treatment surface using a slotted electrostatic shield having uniformly spaced-apart slots. The slotted electrostatic shield is modified in a way which compensates for the asymmetric plasma density pattern to provide a modified plasma density pattern at the treatment surface. A more uniform radial plasma process is described in which an electrostatic shield arrangement is configured to replace a given electrostatic shield in a way which provides for producing a modified radial variation characteristic across the treatment surface. The inductively coupled plasma source defines an axis of symmetry and the electrostatic shield arrangement is configured to include a shape that extends through a range of radii relative to the axis of symmetry.

20 Claims, 15 Drawing Sheets

U.S. PATENT DOCUMENTS

| | | | |
|---|---|---|---|
| 4,948,458 | A | 8/1990 | Ogle |
| 5,057,187 | A | 10/1991 | Shinagawa et al. |
| 5,108,535 | A | 4/1992 | Ono et al. |
| 5,122,251 | A | 6/1992 | Campbell et al. |
| 5,156,703 | A | 10/1992 | Oechsner |
| 5,198,634 | A | 3/1993 | Mattson et al. |
| 5,217,560 | A | 6/1993 | Kurono et al. |
| 5,226,056 | A | 7/1993 | Kikuchi et al. |
| 5,228,052 | A | 7/1993 | Kikuchi et al. |
| 5,234,529 | A | 8/1993 | Johnson |
| 5,284,544 | A | 2/1994 | Mizutani et al. |
| 5,284,547 | A | 2/1994 | Watanabe |
| 5,294,292 | A | 3/1994 | Yamashita et al. |
| 5,304,282 | A | 4/1994 | Flamm |
| 5,310,456 | A | 5/1994 | Kadomura |
| 5,312,518 | A | 5/1994 | Kadomura |
| 5,350,480 | A | 9/1994 | Gray |
| 5,385,624 | A | 1/1995 | Amemiya et al. |
| 5,417,826 | A | 5/1995 | Blalock |
| 5,449,432 | A | 9/1995 | Hanawa |
| 5,449,433 | A | 9/1995 | Donohoe |
| 5,462,629 | A | 10/1995 | Kubota et al. |
| 5,462,635 | A | 10/1995 | Ono et al. |
| 5,518,572 | A | 5/1996 | Kinoshita et al. |
| 5,522,934 | A | 6/1996 | Suzuki et al. |
| 5,534,231 | A | 7/1996 | Savas |
| 5,556,501 | A | 9/1996 | Collins et al. |
| 5,589,737 | A | 12/1996 | Barnes et al. |
| 5,605,637 | A | 2/1997 | Shan et al. |
| 5,626,123 | A | 5/1997 | Johnson et al. |
| 5,647,913 | A | 7/1997 | Blalock |
| 5,662,770 | A | 9/1997 | Donohoe |
| 5,696,428 | A | 12/1997 | Pasch |
| 5,777,289 | A | 7/1998 | Hanawa et al. |
| 5,811,022 | A | 9/1998 | Savas et al. |
| 5,897,712 | A | 4/1999 | Hanawa et al. |
| 5,903,106 | A | 5/1999 | Young et al. |
| 5,998,931 | A | 12/1999 | Donohoe |
| 6,056,848 | A | 5/2000 | Daviet |
| 6,068,784 | A | 5/2000 | Collins et al. |
| 6,074,953 | A | 6/2000 | Donohoe |
| 6,083,344 | A | 7/2000 | Hanawa et al. |
| 6,095,159 | A | 8/2000 | Blalock et al. |
| 6,109,206 | A | 8/2000 | Maydan et al. |
| 6,143,129 | A | 11/2000 | Savas et al. |
| 6,204,604 | B1 | 3/2001 | Donohoe |
| 6,220,617 | B1 | 4/2001 | Hunger |
| 6,239,553 | B1 | 5/2001 | Barnes et al. |
| 6,392,187 | B1 * | 5/2002 | Johnson .................. 219/121.43 |
| 6,446,572 | B1 | 9/2002 | Brcka |
| 6,459,066 | B1 | 10/2002 | Khater et al. |
| 6,475,814 | B1 | 11/2002 | Blalock et al. |
| 6,551,447 | B1 | 4/2003 | Savas et al. |
| 6,706,142 | B2 | 3/2004 | Savas et al. |
| 2002/0185229 | A1 | 12/2002 | Brcka et al. |

OTHER PUBLICATIONS

Cook et al., "Energy Anomalies Observed in Ion Beams Produced by rf Sources," Jun. 1962, The Review of Scientific Instruments, vol. 33, No. 6, pp. 649-652.

Williams, "Extraction of Positive Ions from Electrodeless Discharge," Sep. 1966, The Review of Scientific Instruments, vol. 37, No. 9, pp. 1205-1210.

Letts, S. L. et al., "Laser Program Annual Report-1978, " vol. 1, Lawrence Livermore Report UCRL-50021-78, pp. 4-7 to 4-11.

Letts, S. L. et al., "Laser Program Annual Report-1979," vol. 2, Lawrence Livermore Report UCRL-50021-79.

B1-B5 Photocopies of sections of Lawrence Livermore Laboratory Drawing No. AAA-78-107861-00, Jun. 1978, drawn by R. Dowrick.

Johnson et al., "Plasma Polymerization Coating of DT-Filled Glass Shells for Laser Fusion Targets," 1979, American Chemical Society, pp. 315-330.

Flamm, Letter from D. L. Flamm to B. S. Schneider dated Jul. 8, 1989.

Manza, Letter from August Manza to B. S. Schneider dated Sep. 12, 1989.

Flamm, Letter from D. L. Flamm to A. Manza dated Jun. 18, 1990.

Turban, "Plasma Physics—Study of the electron temperature and density of an inductive HF discharge in hydrogen, using the symmetrical double-probe method", Sep. 27, 1971, C.R. Acad. Sc. Paris, vol. 273, Series B, pp. 533-536. Both the French article and English translation of the text are included.

Turban, "Plasma Physics—Measurement of the energy-distribution function of electrons in an inductive HF discharge in hydrogen, using the asymmetric triple-probe method", Oct. 4, 1971, C.R. Acad. Sc. Paris, vol. 273, Series B, pp. 584-587. Both the French article and English translation of the text are included.

Eckert, "The Hundred Year History of Induction Discharges", 1986, Proceedings 2nd Annual International Conference on Plasma Chemistry and Technology, Herman Boenig, Ed., Techromic Publ., Lancaster, PA, pp. 171-202.

Weynants et al., "ICRH Antenna Design And Coupling Optimization Studies", 1980, Proceedings of the 2nd Joint Grenoble-Vienna International Symposium, vol. 1 (Como, Italy).

Thornton, "Plasma-Assisted Deposition Processes: Theory, Mechanisms and Applications", 1983, Thin Solid Films, vol. 107, pp. 3-19.

Probyn, "Sputtering of Insulators in an RF Discharge", 1968, Vacuum, vol. 18, No. 5, pp. 253-257.

Sugano, "Applications of Plasma Processes to VLSI Technology", 1985, pp. 209 and 213.

Coburn, "Summary Abstract: Ion-Enhanced Gas-Surface Chemistry", Jul./Aug. 1982, J. Vac. Sci. Technol., vol. 21, No. 2, pp. 557-558.

Flamm et al., "The Design of Plasma Etchants", 1981, Plasma Chemistry and Plasma Processing, vol. 1, No. 4, pp. 317-363.

Freisinger et al., "RF-ION Source RIM IO for Material Processing with Reactive Gases", Sep. 19-23, 1988, GD88, Venezia Sep. 19-23, 1988 IX International Conference on Gas Discharges and Their Applications.

Coburn et al., "Positive-ion bombardment of substrates in rf diode glow discharge sputtering", Dec. 1972, J. Appl. Phys. vol. 43, No. 12, pp. 4965-4971.

Freisinger et al., "The neutral particle injectors RIG for fusion reactors", 1984, Atomkernenergie Kerntechnik, vol. 44 No. 1, pp. 81-86.

Vossen, "Glow Discharge Phenomena in Plasma Etching and Plasma Deposition", Feb. 1979, J. Electrochem Soc., vol. 126, No. 2, pp. 319-324.

Two Drawings Labled "Helical Resonator Plasma Coater" Previously Cited and Reviewed for U.S. Appl. No. 5,534,231.

Techniques and Applications of Plasma Chemistry, 1974, John Wiley & Sons, pp. 322-324.

* cited by examiner

- BELOW CALCULATED MEAN
+ ABOVE CALCULATED MEAN

- BELOW CALCULATED MEAN
+ ABOVE CALCULATED MEAN

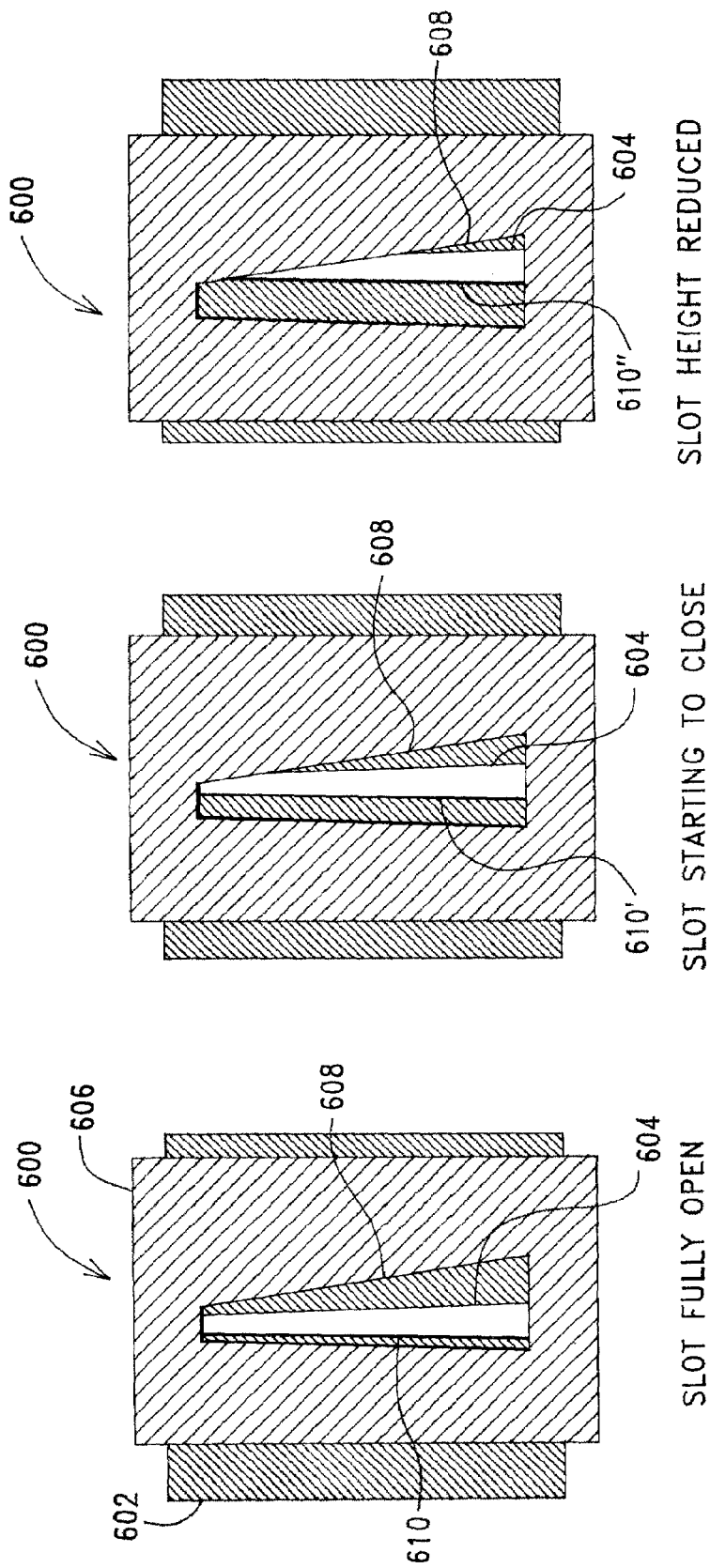
FIG.10b SLOT FULLY OPEN
FIG.10c SLOT STARTING TO CLOSE
FIG.10d SLOT HEIGHT REDUCED

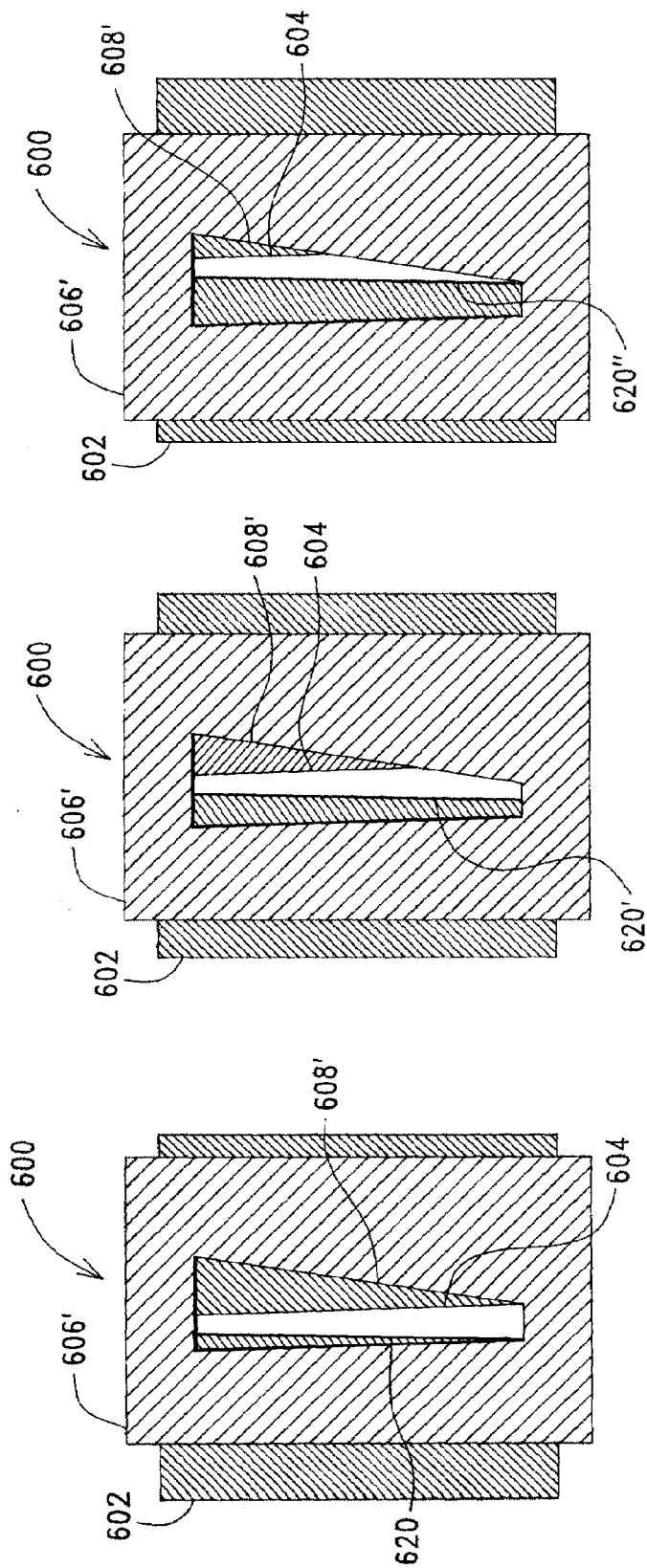

SLOTTED ELECTROSTATIC SHIELD MODIFICATION FOR IMPROVED ETCH AND CVD PROCESS UNIFORMITY

RELATED APPLICATION

The present application claims priority from U.S. provisional patent application Ser. No. 60/459,405 filed on Apr. 1, 2003, bearing the same title, which is incorporated herein by reference in its entirety.

BACKGROUND OF THE INVENTION

This invention pertains generally to manufacturing of semiconductor and/or optoelectronic devices and, more particularly, to a method and apparatus for improving uniformity of etching or deposition of a thin film on a substrate in manufacturing of a semiconductor device.

In manufacturing semiconductor integrated circuit and optoelectronic devices, there are a number processing steps where layers of material are patterned or deposited on the substrate. The rate of etching or deposition of such material is often critical to the success of the process and the proper function of the transistors and interconnects in the integrated circuit or to integrated optical components. To guarantee high die yields, these rates must be tightly controlled and uniform across the entire wafer area. Often, such etching or deposition is done in a reactor where the plasma is generated by an inductively coupled source.

Uniformity of etching, deposition rate or deposited film properties on each wafer in such a reactor depends on maintaining good uniformity of the flux with its reactive constituents, ions and radicals to the wafer. This requires a specific profile of power deposition into the plasma from the induction antenna. This profile, depending on the reactor shape and gas pressure, then makes the generation rates of ions and neutral reactive species nearly constant above the wafer. Both these rates are functions of the gas density and electron energy distribution and they must be reasonably uniform spatially. The energy of plasma electrons in inductively coupled plasma sources is provided by the radio frequency electric field that is generated by the excitation coil or coils. Such coil(s) often provide E-M energy to the plasma in the source in a non-axisymmetric way or distributed radially so that there are azimuthal or radially dependent (respectively) non-uniformities in the plasma adjacent to the wafer. Both non-uniformities need to be eliminated to make the plasma properties and the etching or CVD deposition rate uniform.

Inductive coupling of RF power to the plasma in the source is typically done using an RF coil wound approximately helically around an axi-symmetric vacuum vessel. When powered by an RF power source, this coil produces both RF magnetic and electric fields in the source volume—if there is no electrostatic shield. While the inductive electric field (produced by the changing magnetic flux) is efficient in providing energy to electrons and maintaining the plasma, the electrostatic electric fields (arising from the RF potential on the coil) are not necessary and can cause plasma potential modulation. This electrostatic electric field causes poorly controlled sheath potentials, electrical charge damage to the semiconductor and optical devices, and contributes to the sputtering of vessel material onto the substrate. In order to reduce these problems, a slotted electrostatic shield may be placed between the RF coil and the vacuum vessel (see, for example, U.S. Pat. No. 5,534,231, issued to Savas and which is incorporated herein by reference). Such a shield can significantly reduce the undesirable electrostatic fields from conducting displacement currents from the coil into the plasma—which then causes plasma potential modulation and the other aforementioned undesirable effects. An electrostatic shield of any type may be used with an inductively coupled plasma source, but for RF power to penetrate the shield, a slotted electrostatic shield has been found to be an effective approach.

Electrostatic shields, despite their known benefits for process control and avoidance of metal contamination, have up to this time been seen to have little potential for control of the uniformity of the plasma in inductively coupled plasma sources. Applicants are unaware of any attempt thus far to use electrostatic shields to control the uniformity of a plasma or a process using an inductively coupled plasma.

Referring to FIG. 1, a prior art frustoconical-shaped electrostatic shield 101 is diagrammatically illustrated having a plasma generation coil 102 wound about the shield and having evenly spaced slots 103 distributed about its circumference. Inside shield 101 is a plasma containing vessel 104. Slots 103 extend both above and below the coil turns so as to make magnetic field penetration more efficient. Such shields have virtually always been symmetrical with regularly spaced slots of constant width. Accordingly, such a shield configuration has little or no effect on plasma non-uniformity, either azimuthal or radial. Normally, the most persistent non-uniformity in such plasma sources is the radial non-uniformity. Until this time, the normal way to reduce this type of plasma non-uniformity to low levels has been to use a large plasma source diameter. In order to achieve the few percent uniformity required in etching or CVD systems for semiconductors, plasma sources are normally almost twice the diameter of the wafers processed. Commonly, the plasma source is 14 inches to 16 inches in diameter to provide adequate uniformity for 8 inch wafers, whether shielded or not. Unfortunately, such large sources tend to require proportionally larger wafer transport chambers which makes the etching/CVD system more expensive and requiring proportionally more of the very expensive floor space in a semiconductor fabrication facility (Fab). This appears to be the situation to date, irrespective of the fact that there is an economic reason to make the plasma source of the Etch/CVD chamber as small as possible, consistent with the requisite process uniformity.

Smaller size sources with good radial uniformity have been produced, but only so long as the pressure and power ranges of operation are small. Since the shape of the source has a strong influence on the radial variation in the plasma density, it can be made specifically to optimize uniformity for some narrow source conditions. However, the source cannot then be used for processes with substantially different gas pressures or power levels.

This result obtains since the gas pressure strongly affects the transport of energetic electrons in the source and therefore the ionization rate profile. The ability of a plasma source to be useful at widely different pressure and gas compositions is very valuable for process versatility in the IC Fab. Yet, the economic benefits of the smaller sources are substantial and, therefore, it would be desirable to find a way to make such small sources flexible in the conditions for which uniform plasma density can be achieved.

The azimuthal non-uniformity in the plasma density of a source can be significant for high RF frequency for plasma generation or non-helical excitation coil configurations. In the case of high RF frequency this is due to the variation of the RF current as a function of the position on the coil. Frequencies of 13.56 MHz for a 14-inch plasma source typically result in variations of about 10% to more than 20% variation in the magnitude of the RF current on the excitation coil. Therefore, the azimuthal non-uniformity can be substantial and this will cause there to be an azimuthal variation in the power delivered to the plasma. Such azimuthal variation in power injection will cause a similar type non-uniformity of the plasma density, whose magnitude will depend on the pressure of the gas in the source and its size. Yet, use of such a high frequency for powering the source offers benefits since the generators and matching networks are well understood and it is an ISM standard frequency. Therefore, it would be desirable to have an effective way to compensate for the non-axisymmetry of the power injection from a multi-turn excitation coil.

It is submitted that, in the prior art, the slot density or slot size in electrostatic shields has always been axisymmetric and unable to mitigate or reduce the azimuthal non-uniformity due to the asymmetry of power injection into inductively coupled plasma. For example, U.S. Pat. No. 5,234,529, issued to Johnson, uses axially varying slot lengths or locations to adjust the axial location of a plasma formed in a cylindrical source, but assumes axisymmetry, as well as a proper (uniform) radial density of the plasma. In Johnson, the variable length slots, produced by a two-part shield, are used only with a cylindrical shield, that is disposed directly between the RF coil and the plasma chamber. Johnson explicitly teaches that this shield variability may be used for the purpose of adjusting the position of the plasma above the wafer. Specifically, Johnson teaches using the slot shape adjustment only for adjusting the location of the plasma and not at all the shape of the plasma.

Accordingly, there remains an unfulfilled need in the prior art to reduce or eliminate plasma azimuthal non-uniformity for purposes of enhancing the value of high frequency or non-axisymmetric inductively coupled sources in manufacturing processes. Moreover, it would be desirable to provide for uniform, adjustable radial plasma parameters.

SUMMARY OF THE INVENTION

In a system for processing a treatment object by applying a plasma related process thereto, an apparatus and method are described. In one aspect of the present invention, a more uniform plasma and process are implemented in a processing chamber for treating a treatment surface of the treatment object within the chamber using an inductively coupled plasma source which produces an asymmetric plasma density pattern at the treatment surface using a slotted electrostatic shield having uniformly spaced-apart slots. The slotted electrostatic shield is modified in a way which compensates for the asymmetric plasma density pattern to provide a modified plasma density pattern at the treatment surface. In one feature, a modified slot density pattern in a modified shield is formed such that a first portion of the modified slot pattern adjacent to a first region, which exhibits a reduce plasma density, provides an increased effective aperture that is greater than an average effective aperture of an overall modified slot pattern, to create a modified plasma density in the first region which is greater than the reduced plasma density. In another feature, the increased effective aperture is provided by widening slots asymmetrically within an overall, previously uniform slot pattern.

In another aspect of the present invention, an apparatus and method are described having a processing chamber that uses an inductively coupled plasma source which produces a plasma density having a given radial variation characteristic across a treatment surface of a treatment object therein using a given electrostatic shield. An electrostatic shield arrangement is configured to replace the given electrostatic shield in a way which provides for producing a modified radial variation characteristic across the treatment surface which is different than the given radial variation characteristic. In one feature, the electrostatic shield arrangement produces the modified radial variation characteristic as being more constant across the treatment surface than the given radial variation characteristic. In another feature, the inductively coupled plasma source defines an axis of symmetry and the electrostatic shield arrangement is configured to include a shape that extends through a range of radii relative to the axis of symmetry. In still another feature, the electrostatic shield arrangement includes at least a first, inner shield member and a second, outer shield member. The inner shield member defines a first aperture pattern and the outer shield member defines a second aperture pattern. The outer shield member nests proximate to the inner shield member. The outer shield member is rotated relative to the inner shield member to cause the first aperture pattern to cooperate with the second aperture pattern in a way which provides a range in the modified radial variation characteristic across the treatment surface. In yet another feature, a rotation arrangement senses the modified radial variation characteristic and rotates one of the inner shield member and the outer shield member responsive to a sensed value of the modified radial variation characteristic. In a continuing feature, the electrostatic shield arrangement is configured such that each of the inner shield member and the outer shield member are frustoconical in configuration. The inner shield member includes an inner shield sidewall and the outer shield member includes an outer shield sidewall such that the inner shield sidewall and the outer shield sidewall are adjacent to one another. In an additional feature, the electrostatic shield arrangement includes at least a first shield member and a second shield member. The first shield member defines a first aperture pattern, and the second shield member is supported for linear movement in relation to the first shield member in a way which produces a range in the modified radial variation characteristic across the treatment surface.

BRIEF DESCRIPTION OF THE DRAWINGS

The present invention may be understood by reference to the following detailed description taken in conjunction with the drawings briefly described below.

FIG. 3b is another contour plot showing etch rate across the surface of a wafer produced using a modified electrostatic shield, which replaces the conventional shield in the system used to produce the contour plots of FIG. 3a, having a nonuniform slot density distribution. The contour plots of FIG. 3b exhibit a remarkable correction in the azimuthal nonuniformity, as compared to the plot of FIG. 3a.

FIGS. 10b-10d are diagrammatic, elevational views which illustrate a portion of the inner and outer shield members of FIG. 10a, showing one effective aperture, with the inner and outer shield members in different relative positions, in order to show a few of the effective aperture configurations that can be obtained in this highly advantageous way.

FIGS. 10e-10g are diagrammatic, elevational vies which illustrate a portion of the inner shield member of FIG. 10a along with a modified outer shield member, again showing one effective aperture, with the inner and modified outer shield members in different relative positions in order to show a few of the effective aperture configurations that can be obtained in this highly advantageous way.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

As described herein and has been empirically demonstrated during the development of the present invention, through suitable variations in the slot position and size in an electrostatic shield, interposed between coil and plasma vessel in an inductively coupled plasma, the distribution of the power injected into a plasma source can be modified. Accordingly, the spatial uniformity of the plasma and, therefore, the process to which the plasma is directed can be substantially improved. Such processes include, for example, deposition processes, etching processes and essentially any process in which a planar workpiece surface is to be exposed to a plasma. This is of significant importance, as making the plasma density more uniform will also enable improvement, for example, of etch/strip uniformity when such an inductive coupled plasma is used for IC manufacturing. In general, two types of density improvements are contemplated: (1) an improvement in a density distribution which has azimuthal non-uniformity, and (2) an improvement in a density nonuniformity that is radial. Adjustment of both radial and azimuthal non-uniformities in a fixed manner with a single piece shield are described, as well as automatically and variably adjusting such non-uniformities by using a two-or-more piece shield in which one piece moves relative to the other.

The present application discloses the use of an electrostatic shield made of high conductivity material (such as metal) with slots normally running at least approximately perpendicular to the windings of the coil and parallel to the wall of the source. Such a longitudinal slot arrangement has been used almost universally in the prior art as described in the above incorporated Savas patent and the Johnson patent. As will be further described, what differentiates the present disclosure from the prior art is the use of either variable slot density around the source or varying slot length or width circumferentially in order to reduce the azimuthal or radial non-uniformity of the RF E-M field and consequently improve the uniformity of wafer etch/strip.

Azimuthal Density Adjustment

Figure 1:
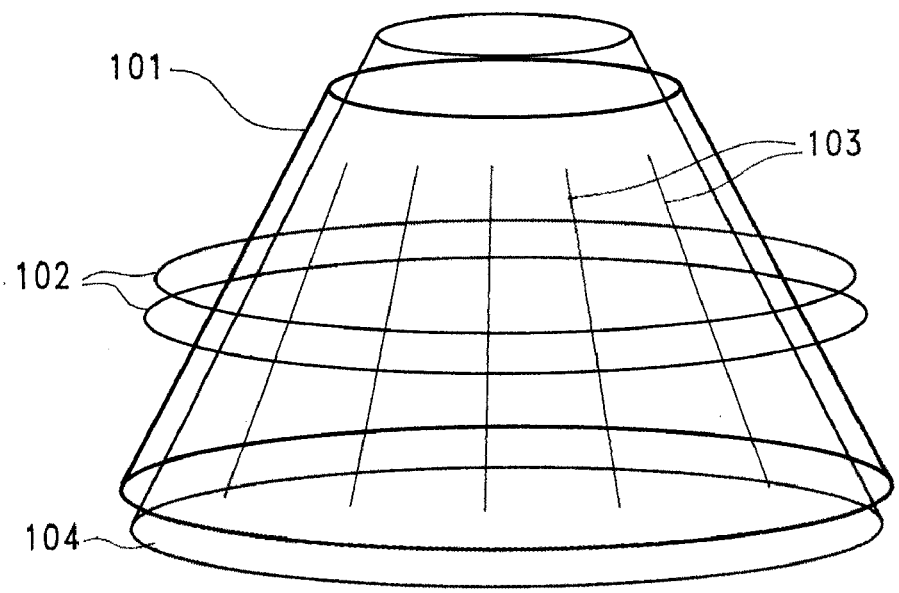
FIG. 1 is diagrammatic perspective illustration of a prior art electrostatic shield assembly and plasma source shown here to illustrate uniform and identically spaced apart slots that are formed in the shield assembly.

Having previously described FIG. 1, reference is now made to the remaining figures wherein like reference numbers may be used to refer to like items throughout the various figures. Moreover, the figures are presented in a way which is diagrammatic in nature for purposes of enhancing the reader's understanding and are in no way intended as limiting. Further, the figures are not to scale and terminology such as, for example, up, down, right, left, top and bottom is utilized for descriptive purposes only and is in no way intended as being limiting with respect to operational orientations.

Figure 2:
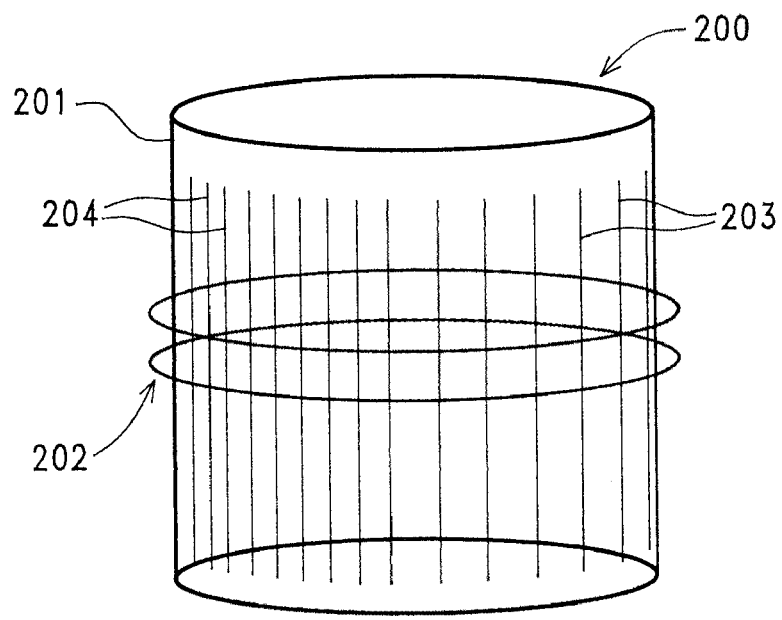
FIG. 2 is a diagrammatic perspective illustration of a cylindrically shaped electrostatic shield of the present invention having a non-uniform slot distribution about its periphery for purposes of correcting azimuthal nonuniformity in a highly advantageous way.

Attention is now directed to FIG. 2 which diagrammatically illustrates one embodiment of an arrangement that is produced in accordance with the present invention and generally indicated by the reference number 200. Arrangement 200 includes a cylindrical shaped electrostatic shield 201 surrounded by a 2-turn RF induction coil 202. A plurality of slots formed in the shield run generally perpendicular to the direction of the RF induction coil. A region 203 is shown on the right (in the view of the figure) with a lower density of slots and a region shown on the left with a higher density of slots. This shield was used to correct a plasma system that, with a uniformly slotted shield, had a non-uniform plasma density and processing rate in which the plasma density on the right was higher than average and that on the left was less than average. That is, azimuthal non-uniformity was present in the unmodified system. This is corrected by using the non-uniformly slotted shield with fewer slots on the right to lower the RF power penetration and plasma density there and more slots on the left to raise the RF power penetration and plasma density there. In this exemplary embodiment, slots in the shield may be distributed with varying spacing (density) around the sides of an axisymmetric plasma source. A relative increase or decrease in slot density can be used to improve azimuthal uniformity of the plasma for either etch or deposition processes.

If the source has a rounded dome shape (with symmetry axis effectively at the North Pole), then the slots are substantially parallel to the meridian lines. In such an embodiment, the excitation coil could be wound about part or the entire dome in a roughly spiraling manner such that the RF current is substantially azimuthal. The slot direction is thereby perpendicular to the azimuthal or circumferential direction about the symmetry axis. Slots may extend at least partially underneath the area covered by the coil. Greater efficiency of power transfer into the plasma is achieved if the slots extend entirely through the region of the dome covered by the coils—both above and below the coil region. If the source were a cylinder then the slots would be purely in the axial direction.

FIG. 2 serves to illustrate the concept of variable slot density wherein the plasma source is cylindrical, although the concept may be applied to any source shape. The slots may extend axially under the area covered by the coils and preferably extend beyond the coil region both above and below, as is illustrated. The method for improving uniformity resides in first determining plasma density distribution with a shield having uniformly spaced slots. The density of slots may then be varied so that the slots are more closely spaced in regions where the plasma density has been found to be low and/or more widely spaced in region(s) where the density has been relatively high. Thus, the area with a higher slot density transmits more power and raises the local plasma density while the area which had high density receives less power after slot redistribution and thereby has reduced density.

Figure 3A:
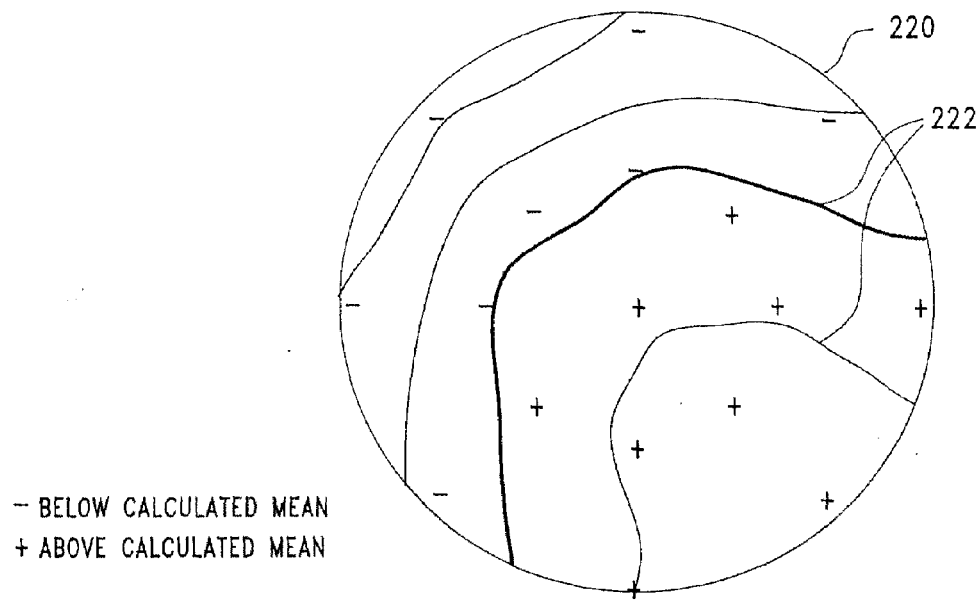
FIG. 3a is a contour plot showing etch rate across the surface of a wafer produced using a conventional electrostatic shield having uniform slot distribution. The contour plots of FIG. 3a exhibit considerable azimuthal nonuniformity.
Figure 3B:
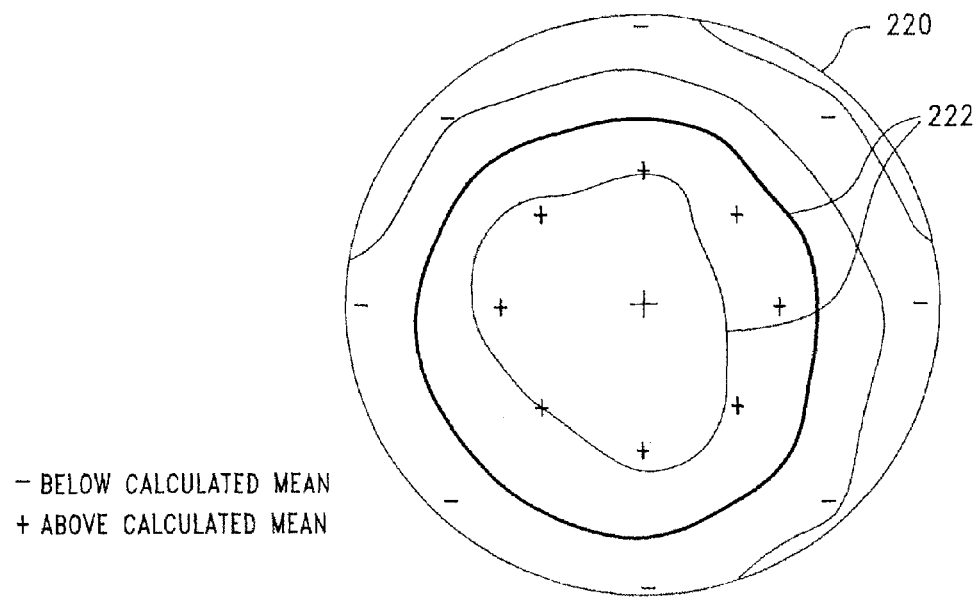

Referring to FIGS. 3a and 3b etching non-uniformity is mapped onto a wafer 220 in which contour lines 222 show contours of equal etching rate. The contours are separated by an equal change in etch rate from one contour line to the next. The same source was used to generate the etch pattern of both figures. FIG. 3a shows the etching rate map with a uniformly slotted shield. Evidently, the penetration of RF power into the plasma is not uniform azimuthally with the uniform shield and the etching rate is substantially higher on one side than the other. After changing the density of slots to a value that is one-half of the original value adjacent to the region of high density, the map of the etching rate is modified to appear as is shown in FIG. 3b. Such a change in slot density is generally demonstrated in the right side region of shield arrangement 200 of FIG. 2 having slots that are more spaced apart as compared to the slot spacing on the left side. In general, the density of slots is increased adjacent to regions of low etch rate and decreased adjacent to regions of high etch rate to adjust and make the etching rate more uniform. Comparison of the etch patterns seen in FIGS. 3a and 3b illustrates a remarkable improvement in azimuthal uniformity. Clearly, the reduced density of slots has shifted the maximum density region close to the center of the plasma and thereby the wafer center.

Since the E-M power penetration into the plasma has also been found to be a monotonically increasing function of the width or length of the slots, the present invention provides for adjustment of the plasma density so as to be more uniform by varying the width (or length) of the slots around the circumference of the source. In this case, the center-to-center distance between slots can be kept constant but the width/length varied. Thus, more power is injected in regions where the slots are wider (slots may be made wider over only part of their length—which may be concentrated at the ends of the slots to minimize electrostatic field penetration) or longer (where the density has been low) and less power is injected in region(s) where the slots are narrowed or shorter (where the density has been high).

These methods, singly or in combination, can fully adjust the azimuthal non-uniformity of the plasma and thereby leave the plasma density (and etching rate or CVD properties) axisymmetric about the symmetry axis of the source. Such techniques rely on azimuthal variation of the slot characteristics—where slots are generally elongated perpendicular to the azimuthal direction.

Radial Density Adjustment

There is a class of slot modifications that will decrease the radial non-uniformity of the plasma and even do so automatically. In one embodiment, this applies to a plasma source in which the coil is adjacent to a slotted electrostatic shield. There are generally two methods that will accomplish radial adjustment of density. First, the slots may be lengthened or shortened at one end or the other, or second, the width of slots may be changed nearer (or at) one end of the slots than the other or along their entire length.

Figure 4:
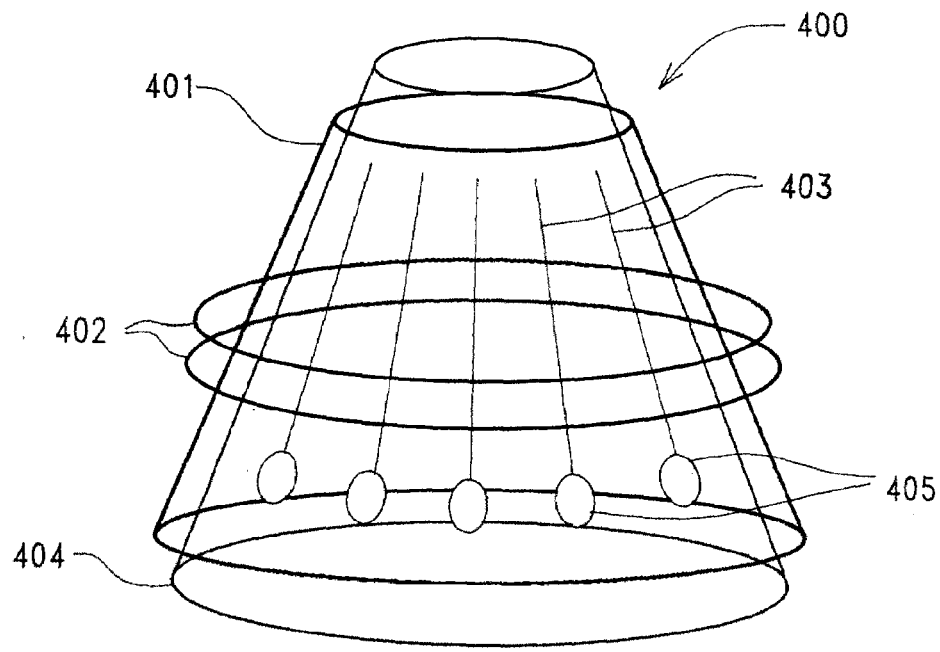
FIG. 4 is a diagrammatic perspective view illustrating one embodiment of an electrostatic shield assembly of the present invention having an enlarged region in each slot for purposes of adjusting radial nonuniformity.
Figure 5:
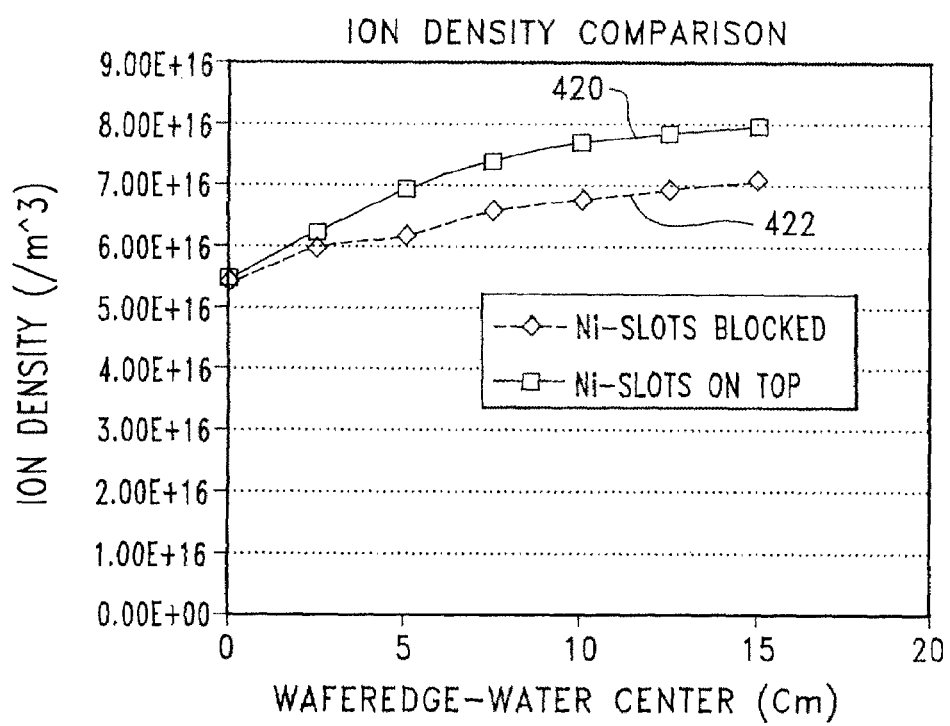
FIG. 5 is a dual plot of ion density versus radial distance, that is, a wafer edge to wafer center radial distance, having one plot produced using a conventional electrostatic shield and another plot produced using a modified electrostatic shield having modified slots so as to greatly improve radial uniformity.

Referring now to FIG. 4, a conical shield arrangement, produced in accordance with the present invention, is generally indicated by the reference number 400. Shield arrangement 400 includes an electrostatic shield 401 with a plasma generation coil 402 wound about the shield and evenly spaced slots 403 distributed about its circumference. Inside the shield is a plasma containing vessel 404. Slots 403 extend both above and below the coil turns so as to make magnetic field penetration more efficient. The slots are defined having an enlarged portion or enlarged aperture 405 at the lower/outer end so as to allow more magnetic field penetration. It has been empirically demonstrated that enlarged portions 405 serve to increase the density at the outer reaches of the plasma and thereby increase etching rate at the outer periphery of the wafer. Apertures 405 have the effect of moving the plasma lower in the plasma vessel and increasing the RF penetration at the outer edge of the plasma vessel while relatively reducing the RF penetration at the center of the plasma vessel, thereby changing the radial uniformity of the plasma and the resultant radial etch or deposition uniformity of wafers processed in this environment. It should be appreciated that the shape of the enlarged portions of the slot may be modified in a wide variety of ways while still providing the advantages brought to light therein. In terms of modifying a shield member as described throughout this disclosure and in the appended claims, it is contemplated that the original shield member can be changed, in some instances, for example, by widening apertures such as slots or by forming new apertures while, in other instances, it may be necessary to provide a new/modified shield member, for example, when an existing arrangement of apertures incompatibly overlaps the desired modified pattern of apertures that is to be formed. FIG. 5 illustrates actual measured ion density in a plasma source having another form of modified shield, yet to be described, as compared to the ion density that is present using a uniform shield. Ion density is plotted against distance measured radially from the outer edge of the wafer to the center of the wafer. A frustoconical shield configuration is used, appearing as shown in FIG. 4. Ion density using the unmodified shield is indicated by the reference number 420, while the modified ion density provided by the modified shield is indicated by the reference number 422. Plot 420 (shown as a solid curve) is produced in the source with an electrostatic shield having slots extending over the top of the source. That is, extending above coil 402 in the view of FIG. 4. When part of the slots closest to the axis of the source is blocked (a top portion of slots 403 in the view of the figure), the density in the center is reduced, as shown by the dashed curve 422 in FIG. 5. It is noted that the density at the edge of the plasma (hence, at the outer edge of the wafer) is nearly unchanged when comparing the plots, indicating that the power deposition in the plasma there is essentially unchanged. The slots may be blocked in any appropriate manner such as, for example, by using metal covers. In another embodiment, a magnetic field control plate made of conducting material may be moved, toward and away from the electrostatic shield, wherein the control plate is controllably moved, as will be seen with reference to subsequent ones of the figures.

In an automatic plasma tuning implementation, real-time inputs can be employed using sensors measuring parameters at a wafer surface such as, for example, etch and/or deposition rates at specific positions on the surface of the wafer. For instance, deposition and etch rates can be measured for certain materials using optical reflectometry. Moreover, any suitable optical emission techniques can be used to measure etch and/or deposition rates at localized, spaced apart positions for use in determining uniformity. A wide variety of motor and control arrangements may be used in such automatic implementations.

Figure 6A:
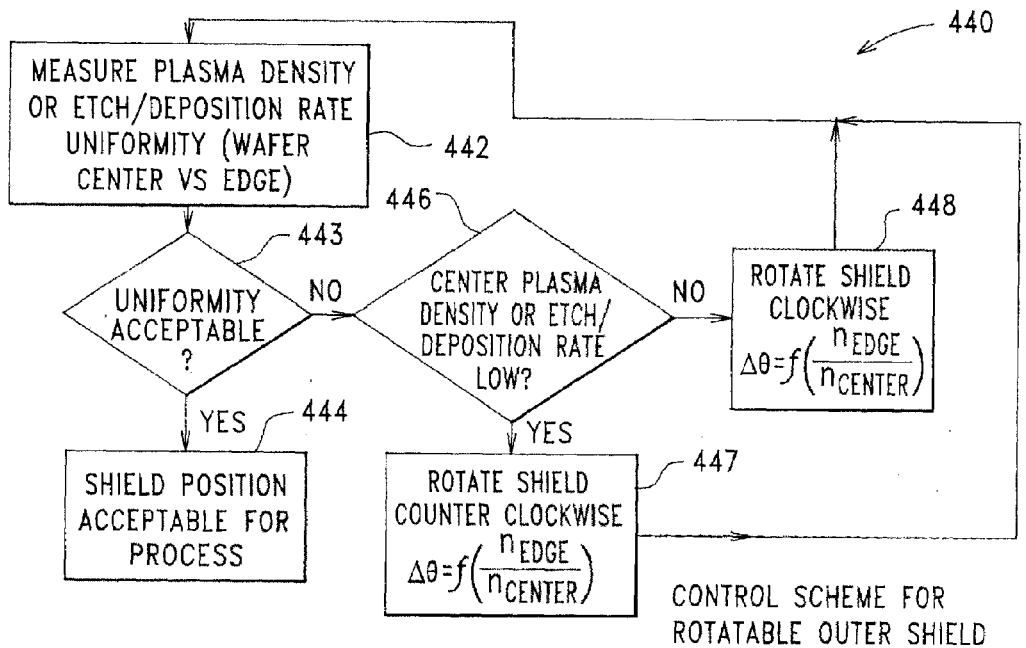
FIG. 6a is a flow diagram illustrating one implementation of a process for controlling the rotational position of one part of a multipart electrostatic shield assembly for use in optimizing radial uniformity.
Figure 6B:
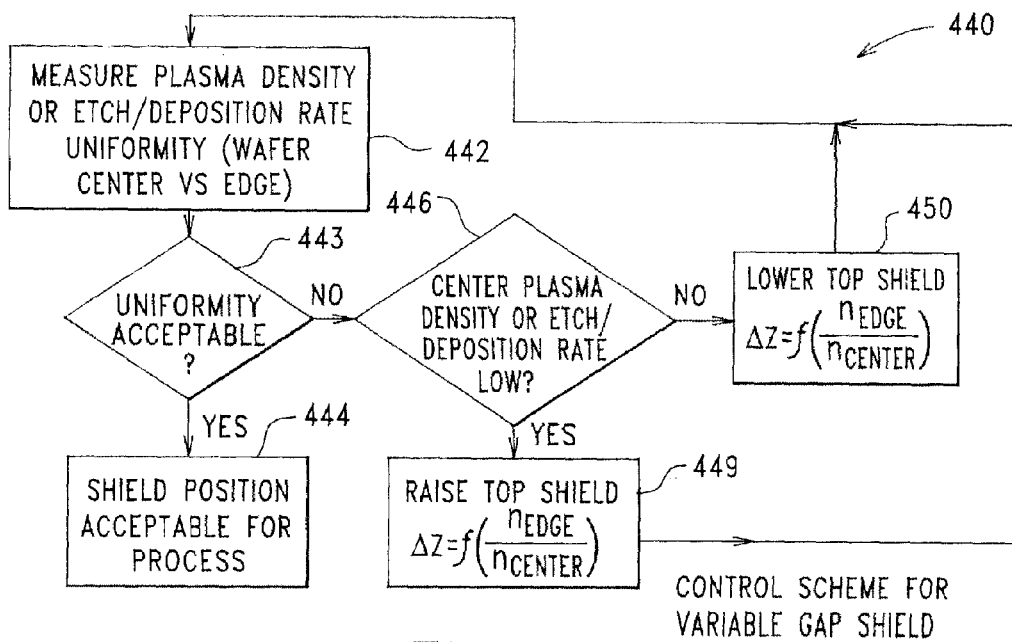
FIG. 6b is a flow diagram illustrating one implementation of a process for controlling the spatial relationship of one part of a multipart electrostatic shield assembly relative to other components of the assembly for use in optimizing radial uniformity.

FIGS. 6a and 6b illustrate automated control schemes for operating a two-part electrostatic shield assembly. In particular FIG. 6a illustrates a method generally indicated by the reference number 440 for operating a rotatable shield member. With this control scheme, the outer or top shield of the assembly is rotated to vary the radial RF penetration into the plasma vessel by varying the resultant shape or size of the slots (i.e., effective apertures) that results from a rotation of the two overlaying patterns of openings in each of the separate shield components, as will be further illustrated by subsequent ones of the figures. At step 442 suitable measurements indicative of uniformity are performed. Step 443 determines whether the result of the uniformity measurement is acceptable. If the uniformity is acceptable, step 444 leaves the shield in its current position. If the uniformity is outside the required tolerance, step 446 compares the wafer center uniformity (e.g., etch rate or deposition rate) to the wafer edge uniformity. If the wafer center process rate is low, step 447 rotates the rotatable shield portion in a direction which increases the wafer center process rate. In the present example, this direction is indicated as being counter clockwise. The change in rotational orientation is a function of process rate differential from center to edge or plasma density differential. On the other hand, if the wafer center process rate is high relative to the wafer edge process rate, step 448 rotates the rotatable shield portion in an opposite direction (clockwise in the present example) to decrease the wafer center process rate. This overall procedure may be repeated in any suitable manner throughout the overall processing of the wafer. FIG. 6b shows a control scheme for operating shield portions that can be spaced-apart to influence radial uniformity. With this control scheme, the outer or top shield of the assembly is lifted to vary the radial RF penetration into the plasma vessel by varying the resultant shape or size of the slots that results from a change in the gap between the two separate shield components, as will be further described with reference to subsequent ones of the figures. The technique utilizes most of the steps previously described with respect to FIG. 6a and these steps are arranged in essentially the same manner. Step 447, however, is replaced by step 449 which increases separation of the shield portions so as to increase the relative wafer center process rate, while step 450 decreases separation of the shield portions so as to decrease the relative wafer center process rate. The change in distance between the two parts of the shield arrangement changes process rate from wafer center relative to wafer edge.

As an alternative, a method may be employed in which off-line measurements may be taken across a treatment surface to determine uniformity parameters. Thereafter, adjustments may be performed to influence treatment in a desired way such as, for example, to enhance uniformity.

In case slots are blocked or widened more toward one end of the slots than the other, the distribution spatially of the RF E-M radiation penetrating the shield is changed. Blocking or widening slots shifts the radial plasma generation profile due to a change in the distribution of power absorbed in the plasma. This then causes a changed distribution of electron heating and, as a consequence, the radial profiles of the ionization rate, plasma density and etching rate are changed.

In one embodiment, the top of the plasma source may be a truncated conical shape with the center aperture of the source being higher than the uppermost edge of the shield. (Similar to the source in FIG. 4). In this case, when the slots in the shield are lengthened or widened at the bottom (which is more distant from the axis), it permits increased E-M radiation penetration at or across a larger radius in the plasma. If, on the other hand, the slots are narrowed or blocked entirely closer to the center axis of the reactor, it causes the plasma density at the edge of the wafer to increase relative to that at the center of the wafer, due to greater power injection at the outer radius. Toward the purpose of making the plasma more uniform, this latter alteration in the shield would compensate for the unmodified plasma density being higher toward the center, increase the density and etch rate at the edge and result in a more uniform etch/strip process.

In another embodiment of the present invention, the shield may consist of two parts, one fixed with a given slot configuration and a second part at least partially overlaying it with a slotting pattern which is complementary to that in the first part. Such a pattern, for example, could include slots of constant width in the first part and triangular slots with the same center-to-center angular spacing in the second part. As the second part is made to rotate with respect to the first part, the length of the slots changes and the radial distribution of power into the plasma is made to change with a consequent shift in the distribution of the plasma density and the etching rate.

Figure 7A:
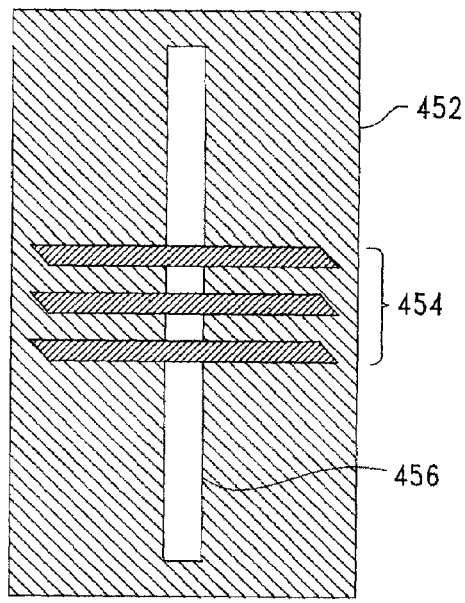
FIG. 7a is a partial diagrammatic, elevational view of an inner shield member which forms one part of an electrostatic shield assembly defining a plurality of spaced apart slots, but only one of which slots is shown.
Figure 7B:
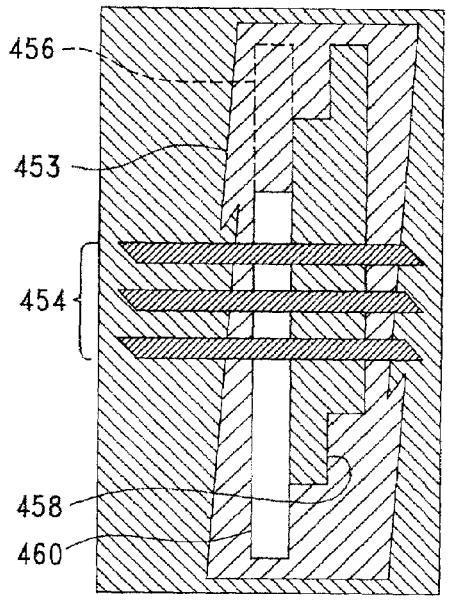
FIGS. 7b-d are partial diagrammatic, elevational views of the inner shield member of FIG. 7a having an outer shield member (only partially shown) arranged proximate to the inner shield member to show how an effective aperture can be varied by rotating the inner and outer shield members relative to one another.

FIGS. 7a-d diagrammatically illustrate the operation of an embodiment having an inner shield member 452 and an outer shield member 453, each of which is only partially shown. Such multi-piece shield arrangements, like a single piece shield, may be formed using any suitable metal such as, for example, aluminum or copper and using any suitable metal forming techniques such as, for example, machining, rolling and welding. These figures depict how rotating the outer shield of a two-part electrostatic shield assembly can vary the height of an effective slot relative to the position of the RF induction coil (only partially shown). Even though only one slot arrangement is shown, it will be appreciated that any number of slots may be formed within the same shield assembly. FIG. 7a illustrates inner shield member 452 and an induction coil 454 without the outer shield member, for purposes of clearly defining these features with respect to the outer shield member. The inner shield defines an inner shield slot 456. FIG. 7b additionally illustrates a cut out section of outer shield member 453 overlaying inner shield member 452. A staggered aperture pattern 458 is defined by this section of outer shield member 453. Cooperation of the inner and outer shield results in defining an effective opening/aperture 460 extending upward from the lowermost end of inner shield slot 456. As will be seen, relative rotation of the two shield members results in a vertical movement of the effective opening.

Figure 7C:
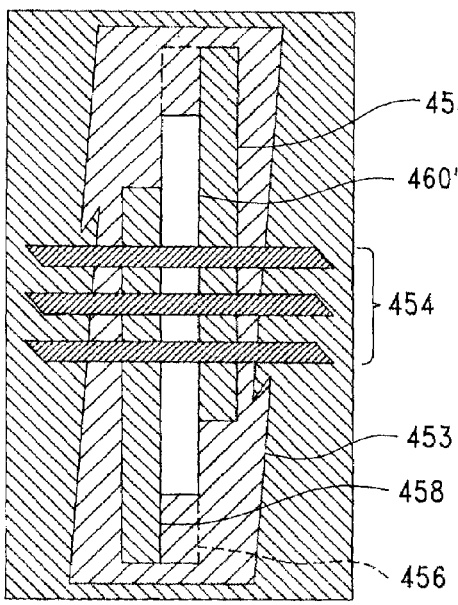

FIG. 7c depicts how rotating the outer shield of the two-part electrostatic shield assembly can vary the height of the slot relative to the position of the RF induction coil position. Specifically, the inner and outer shield positions cooperate to define an effective opening 460' that is of a length that is approximately equal to the length of effective aperture 460 in FIG. 7a, but which is moved upward so as to be centered with respect to induction coil 454. This change, like any other such change in the relative slot positions, changes the radial plasma density which will have a resultant effect on the radial uniformity of an etch or deposition process.

Figure 7D:
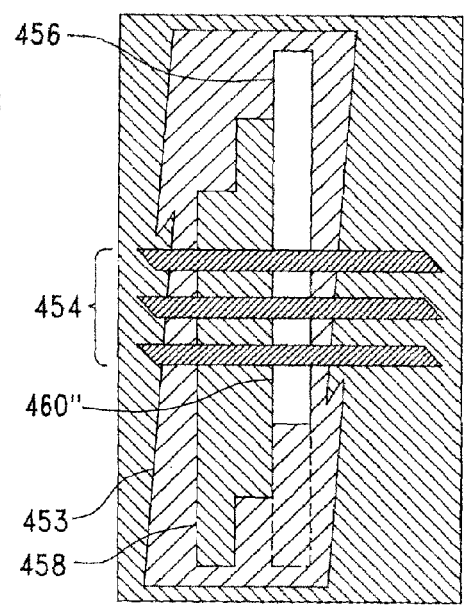

FIG. 7d illustrates a further change in the rotational relationship between inner shield 452 and outer shield 453 so as to produce an effective aperture 460" that is displaced upward by an amount that is opposite of the position of effective aperture 460 in FIG. 7a with respect to induction coil 454. This change in the relative slot position will change the radial RF field penetration into the associated plasma vessel (not shown) and have a corresponding effect on the radial plasma density which will have a resultant effect on the radial uniformity of an etch or deposition process.

Referring again to FIGS. 7a-d, an aperture of a fixed length can be moved along the length of an unmodified slot in a highly advantageous way. The change in the relative height of the effective slot can be incremental or continuous using the depicted concept, as will be further described. Other opening patterns can be used to achieve different rates of RF penetration change relative to the rotation of the two shield components. It should be appreciated that this concept can be applied in a wide variety of ways in view of this description. For example, outer shield 453 can define a slot corresponding to the full length of slot 456 for alignment therewith to selectively provide an effective aperture of this full length. As another example, the patterns in the inner and outer shields may be exchanged.

Figure 7E:
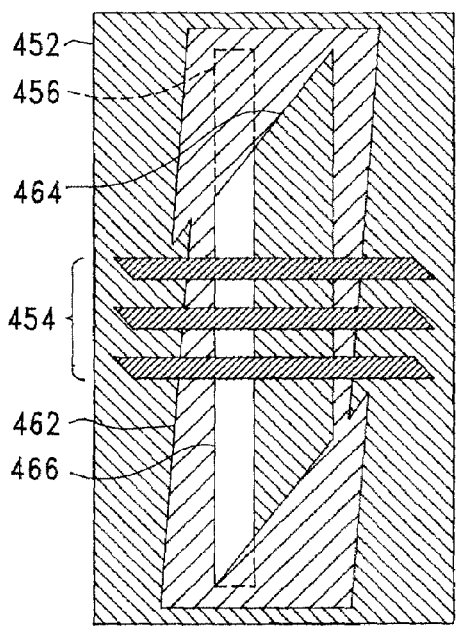
FIGS. 7e-g are partial diagrammatic, elevational views of the inner shield member of FIG. 7a having a different outer shield member (only partially shown) arranged proximate to the inner shield member to show how an effective aperture can be varied by rotating the inner and outer shield members relative to one another so as to produce a continuous change in the position of the effective aperture.
Figure 7F:
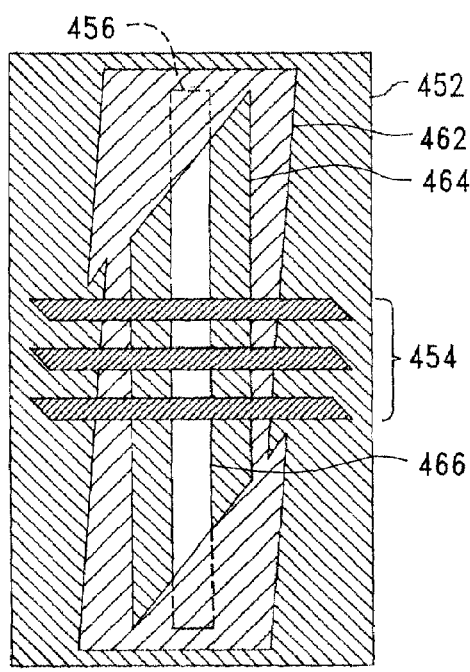
Figure 7G:
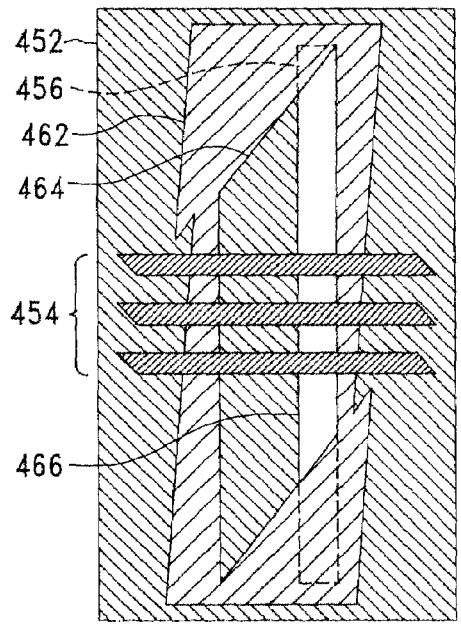

In FIGS. 7e-g, outer shield 453 of FIGS. 7b-d has been replaced with a modified outer shield 462, only a section of which is shown defining an outer shield aperture 464. This outer shield aperture is representative of a geometric shape having continuous, rather than stepped edges, so as to produce a continuous change of effective aperture with respect to one or both of aperture length and vertical position as the inner and outer shield members are moved to change their relative positioning. FIG. 7e illustrates an alignment between inner shield aperture 456 and outer shield aperture 464 cooperating to define an effective aperture 466 extending upward from a lowermost end of slot 456 and having an overall parallelogram shape. FIGS. 7f and 7g illustrate different positions of effective aperture 466 with further rotation of one shield member relative to the other shield member. Accordingly, the position of the effective aperture can be changed in a continuous manner to vary the height of the effective aperture relative to the position of RF induction coil 454. That is, this embodiment provides for continuous modification of the slot position as well as the capability for varying the effective length of an upper and lower effective aperture proximate to the ends of unmodified slot 456. This change in the relative slot position will change the radial RF field penetration into the associated plasma vessel (not shown) and will have a corresponding effect on the radial plasma density which will have a resultant effect on the radial uniformity of an etch or deposition process. Many other opening patterns can be used to achieve different rates of RF penetration change relative to the rotation of the two shield components. All of these modifications are readily performed having this overall disclosure in hand.

Figure 8A:
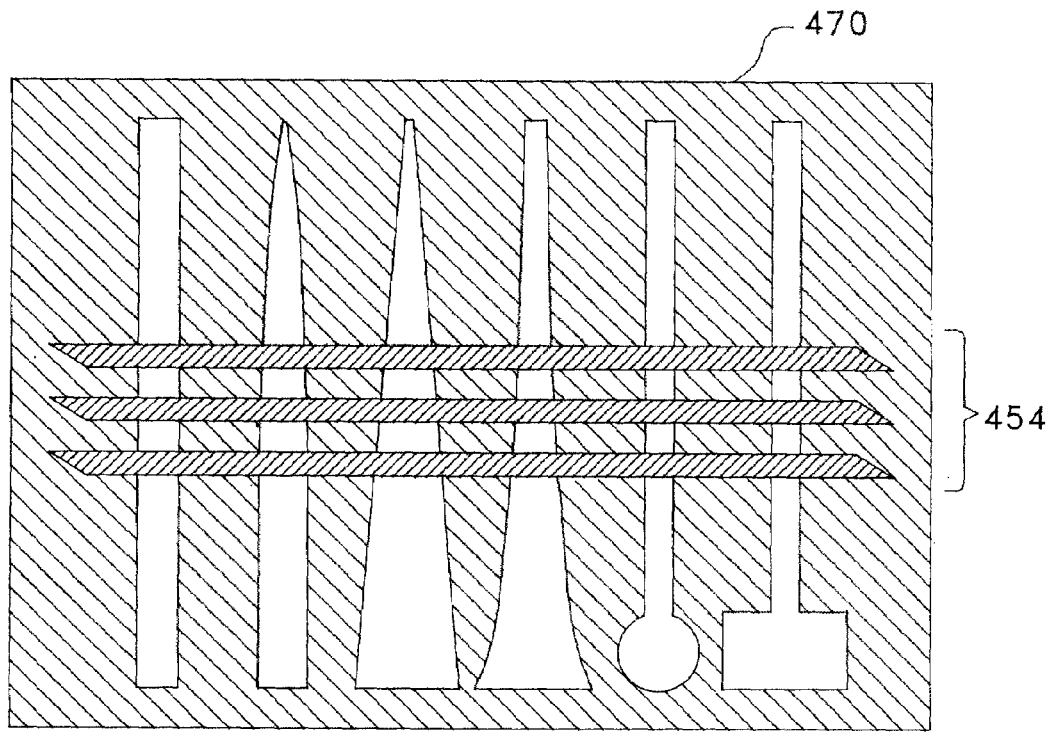
FIGS. 8a and 8b illustrate a shield member in a partial diagrammatic, elevational view having a variety of exemplary slot shapes formed therein for use in moderating RF penetration.

FIG. 8a depicts a shield member 470 having a variety of different shaped slots formed therein to serve as examples of a few of the many various slot shapes, most of which are asymmetric, that can be used to moderate the RF penetration into an associated plasma vessel (not shown). Each shape (generally used with other slots of the same or a similar shape) will result in different radial RF penetration into the associated plasma vessel, thereby each shape will affect the result plasma density and radial uniformity over a range of plasma process parameters such as, for example, pressure, power, gas type, gas flow and bias. It is noted that these shapes can be used in one-piece shields or in two-piece shields cooperating with other suitable shapes.

FIG. 8b again depicts shield member 470 having another variety of different shaped slots formed therein to serve as examples of a few of the many various symmetrical slot shapes that can be used to moderate the RF penetration into an associated plasma vessel (not shown). Again, each shape will result in different radial RF penetration into the associated plasma vessel, thereby each shape will affect the resultant plasma density and radial uniformity over a range of plasma process parameters. It is again noted that these shapes can be used in one-piece shields or in two-piece shields cooperating with other suitable shapes.

Figure 8B:
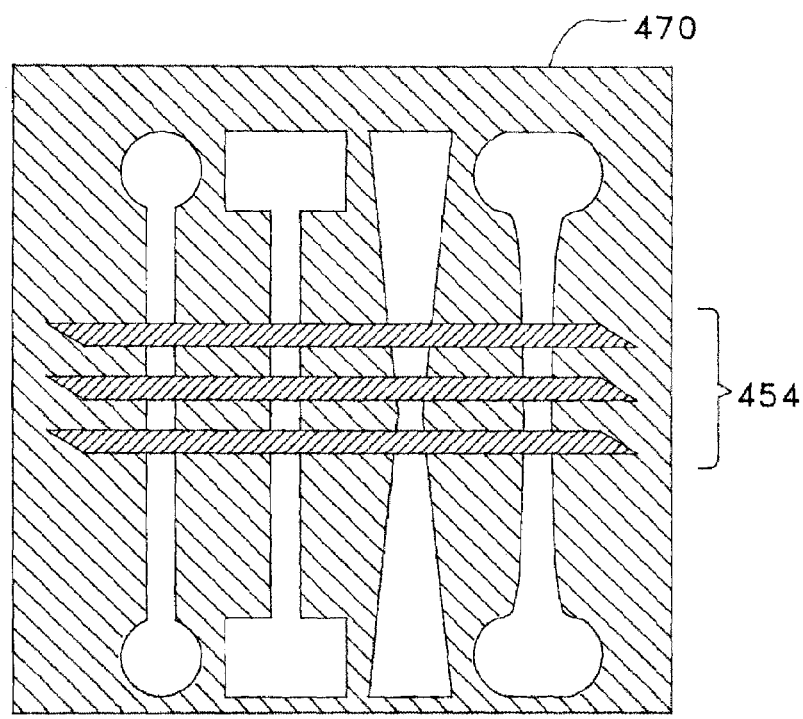

It is noted that the shapes in FIGS. 8a and 8b will effect the radial non-uniformity when they are part of a shield that is configured to include a shape that extends through a range of radii relative to an axis of symmetry of the plasma source. As non-limiting examples, the shield may be conical, frustoconical, trapezoidal (in cross section) or dome-shaped. In these cases, the field will be enhanced in the lower region of the vessel. Of course, these shapes may be inverted to enhance the field in the upper portion of the vessel.

Figure 9A:
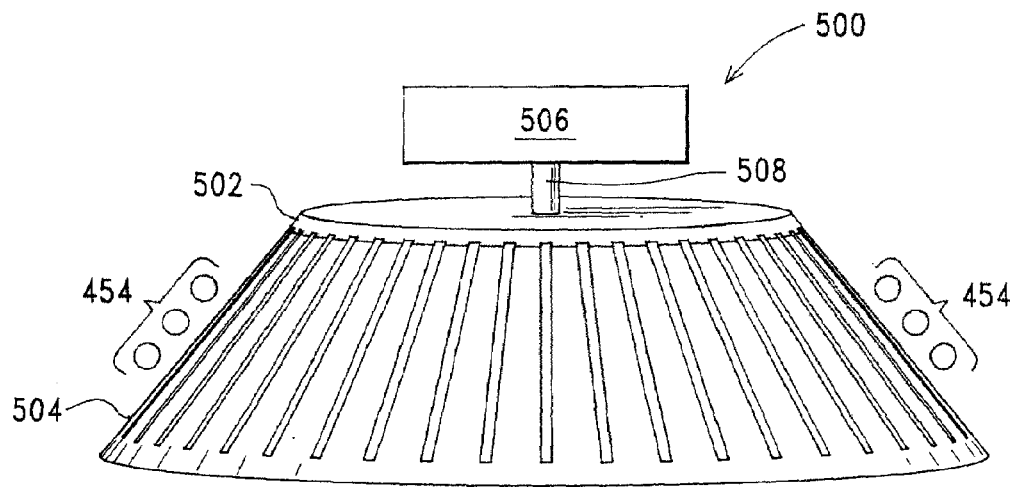
FIGS. 9a-9c are diagrammatic perspective views of a two-part electrostatic shield assembly, shown here to illustrate the overall configuration of the assembly and the way in which a magnetic control plate can be moved in a spaced apart relationship with the remainder of the assembly to vary RF magnetic field penetration.

Attention is now directed to FIG. 9a which illustrates another embodiment of the electrostatic shield arrangement of the present invention, generally indicated by the reference number 500. Arrangement 500 includes a magnetic field control plate 502 that is movable in relation to a slotted frustoconical shield member 504 that is arranged around a plasma source (not shown). A lift motor 506 is connected to control plate 502 by a shaft 508 for use in moving the control plate in relation to shield member 504. It is noted that automated control may readily be implemented based upon FIGS. 6a-b and their associated descriptions appearing above.

Figure 9B:
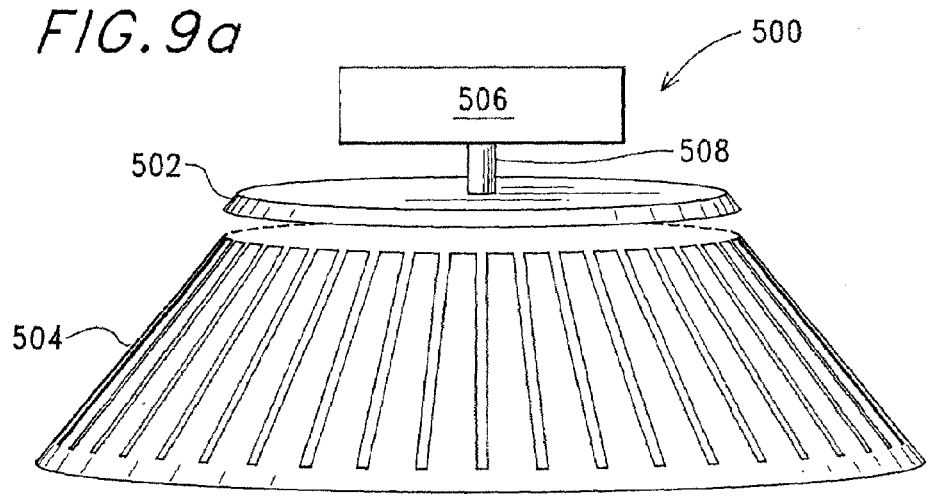
Figure 9C:
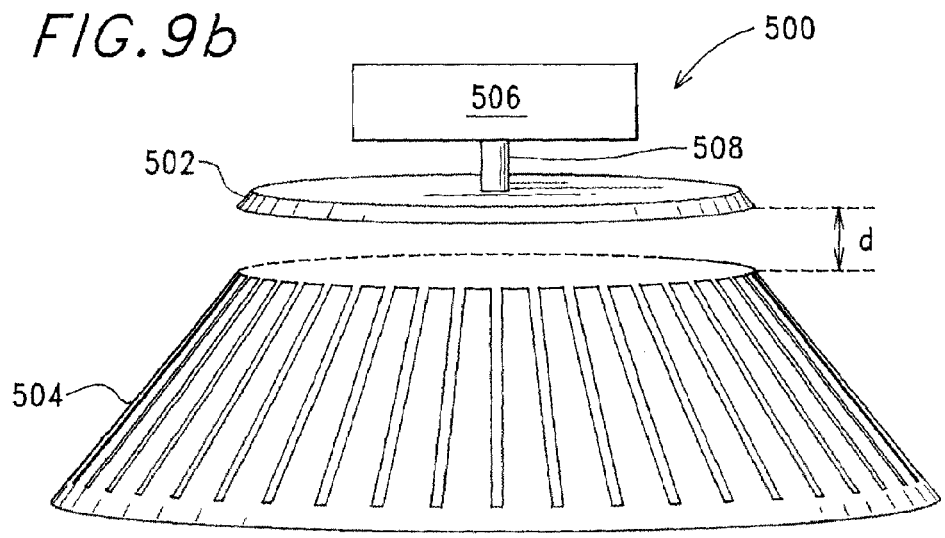

FIG. 9a shows plate 502 arranged at least approximately on shield member 504 such that the control plate appears much as a "hat", while FIGS. 9b and 9c serve to show plate 502 moved to positions that are spaced apart from the shield member. Using such relative movement, the RF field penetration into the center of the associated plasma vessel is affected by changing the gap distance between the magnetic field control plate and the electrostatic shield. The gap can be zero or it can be large. When the gap is large (FIG. 9c) with the control plate a distance "d", magnetic field penetrates into the vessel with a higher relative density at the center of shield member 502 than when the gap is small. This is caused by the large open area at the top of the vessel (shield member 504), between the shield and the control plate, where large field densities can penetrate through. With the control plate at the lowest position (FIG. 9a), where the gap between the shield and control plate is zero, the magnetic field lines that would have been able to penetrate the center of the vessel with little impediment are now be completely impeded. As a result, plasma density is relatively higher at the outer radius of the vessel and thereby the wafer (not shown). This ability to vary the magnetic flux density allows control of the radial etch or deposition uniformity.

Still referring to FIGS. 9a-c, the bottom part of the shield arrangement generally is the slotted part and may have the largest part of the induction coil adjacent to it, although this is not a requirement. The slots in the lower part may be long enough that they extend all the way to the top of the bottom shield member, as shown, although this is not a requirement. The top section (i.e., the magnetic control plate) of the arrangement is generally lacking in slots and thick enough so that it does not allow magnetic flux to penetrate it. Again, when this top part of the shield is removed or vertically raised significantly, it allows a large amount of magnetic flux to enter the center of the source and pass into the plasma. The increased field penetration at the center increases the E-M power injection and the plasma density there and therefore increases relative etch/strip rate at the center of the wafer. Such a shield top may be moved up to allow more power penetration in the center or moved down to allow less power penetration there.

In using the embodiment of FIGS. 9a-c, induction coil 454, illustrated diagrammatically using circles outward of the shield assembly (only shown in FIG. 9a, although the coil is understood to be present in the remaining figures), and shield arrangement 500 may be configured so that the plasma density (and etching rate) is uniform at low gas pressure with control plate 502 of the shield adjacent to the plasma source. When the gas pressure in the source is raised, the density and etching rate are decreased nearer the center part of the plasma. In this higher pressure situation, the top part of the shield may then be raised some distance so that more power is coupled nearer the plasma center. If the shield is properly configured, the plasma density and etching rate may again be raised in the center and made roughly equal to that at the edge. Thus, the moving of the top part of the shield becomes a means of adjusting the radial distribution of power injection to compensate for the reduced electron heat transport and make the plasma remain uniform. In practicing this embodiment, one may pre-determine what the precise dimensions of the shield top and source configuration should be so that movement of the top causes the plasma density and etching rate to be more uniform under the desired range of pressures.

Referring to FIGS. 10a-d, still another embodiment of the electrostatic shield assembly of the present invention is generally indicated by the reference number 600. Assembly 600 varies RF field penetration into the plasma vessel (not shown) through the relative rotation of the two different components of the assembly. While both components could move, it is more convenient to hold one part stationary and to only move the other part. Shield assembly 600 is made up of a stationary inner shield 602 defining a plurality of rectangular slots 604 and a rotatable outer shield 606 defining a plurality of trapezoidal-shaped apertures 608. Such rotation is accomplished using a motor 609a rotatably connected to outer shield 606 by a shaft 609b for rotation by as indicated by an arrow 609c. Motor 609a may be controlled using a suitable controller 609d. Such a control arrangement is readily implemented and may be used to provide rotational control for any embodiments which require it. Slight modification provides control in which linear rather than rotational movement is employed. It is noted that any suitable shape "slot" (generically, an opening) may be used in combination with any suitable shaped "aperture" and that the present illustration is in no way intended as being limiting.

FIGS. 10b-d illustrate the operation of shield arrangement 600 by showing enlarged views of portions of inner shield 602 and outer shield 606 including one of slots 604 and one of apertures 608, respectively, in three of an unlimited number of mutual orientations with relative rotation. In this figure, the top height and width of an effective aperture is adjustable. FIG. 10b illustrates an effective aperture 610 that is rectangular but more narrow than slot 604 of the inner shield member while the length of the effective aperture is unchanged relative to slot 604. FIG. 10c illustrates an effective aperture 610' wherein the upper extents are narrowed relative to slot 604. FIG. 10d illustrates not only a narrowing of the upper extents of an effective aperture 610", but a reduction in its height compared to slot 604. Accordingly, the effective aperture size is reduced or increased relative to the fixed position of the RF induction coil (not shown) and a fixed bottom position of the effective apertures is provided, thereby changing the RF penetration into an associated plasma vessel (not shown). Other opening patterns can be used in the shields to create different RF penetration densities.

Figure 10A:
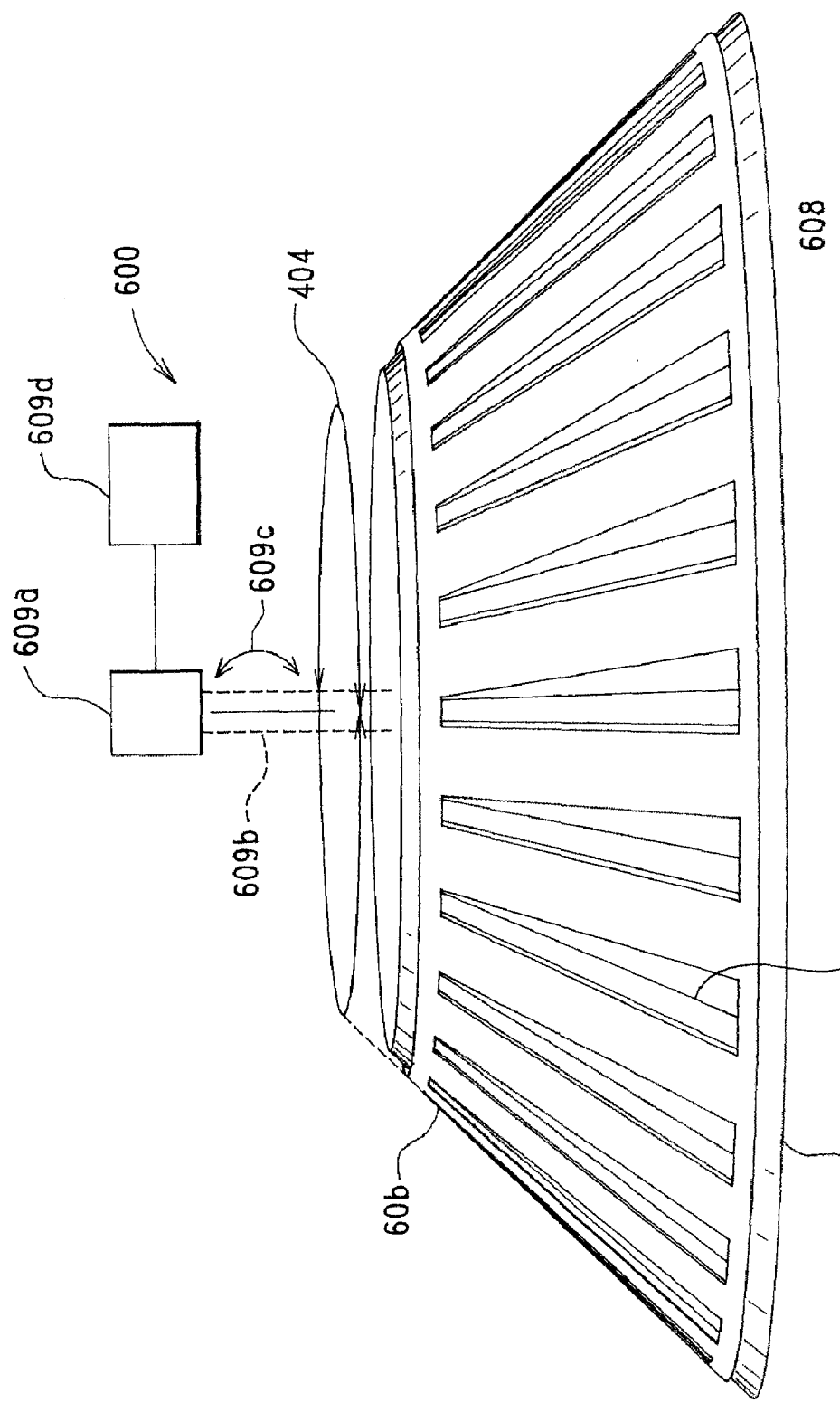
FIG. 10a is a diagrammatic perspective view of a two-part electrostatic shield assembly having inner and outer frustoconical shield members, each of which define different slot shapes which cooperate with rotation of one shield member relative to the other in a way which changes the shape and area of each one of an overall pattern of effective apertures that is defined by the shield members.

FIGS. 10e-g illustrate shield arrangement 600 using a modified outer shield member 606'. Essentially apertures 608 of FIGS. 10a-d are inverted and indicated using the reference number 608' in FIGS. 10e-g. Accordingly, uppermost extents of an effective aperture 610' is preserved while the lowermost extents of the effective aperture can be decreased in width or the effective aperture can be progressively shortened. That is, the bottom position of the slots is reduced or increased relative to the fixed position of the RF induction coil (not shown) and a fixed top position of the slots is provided, thereby changing the RF penetration into an associated plasma vessel (not shown). Specifically, FIG. 10e illustrates an effective aperture 620 having the full length of slot 604 but a reduced width. FIG. 10f, illustrates an effective aperture 620' having a narrowed lower portion, while FIG. 10g illustrates an effective aperture 620" having a still further narrowed lower portion. As mentioned, other open patterns can be used to create different RF penetration densities.

Again considering the aforedescribed invention by Johnson, only a cylindrical shield is taught. The highly advantageous two-part slotted shield of the present invention, for varying plasma radial uniformity, is not a cylindrical shield. The present invention recognizes that a shield with a shape that covers a range of radii relative to the symmetry axis of the system (i.e., part of a cone surface, flat-top, or dome surface) is highly advantageous. With this type of shield, the slot variability is capable of producing a change in the radial distribution of power injection into the plasma. This change in the power injection distribution results in a change in the radial density distribution of the plasma.

Figure 11A:
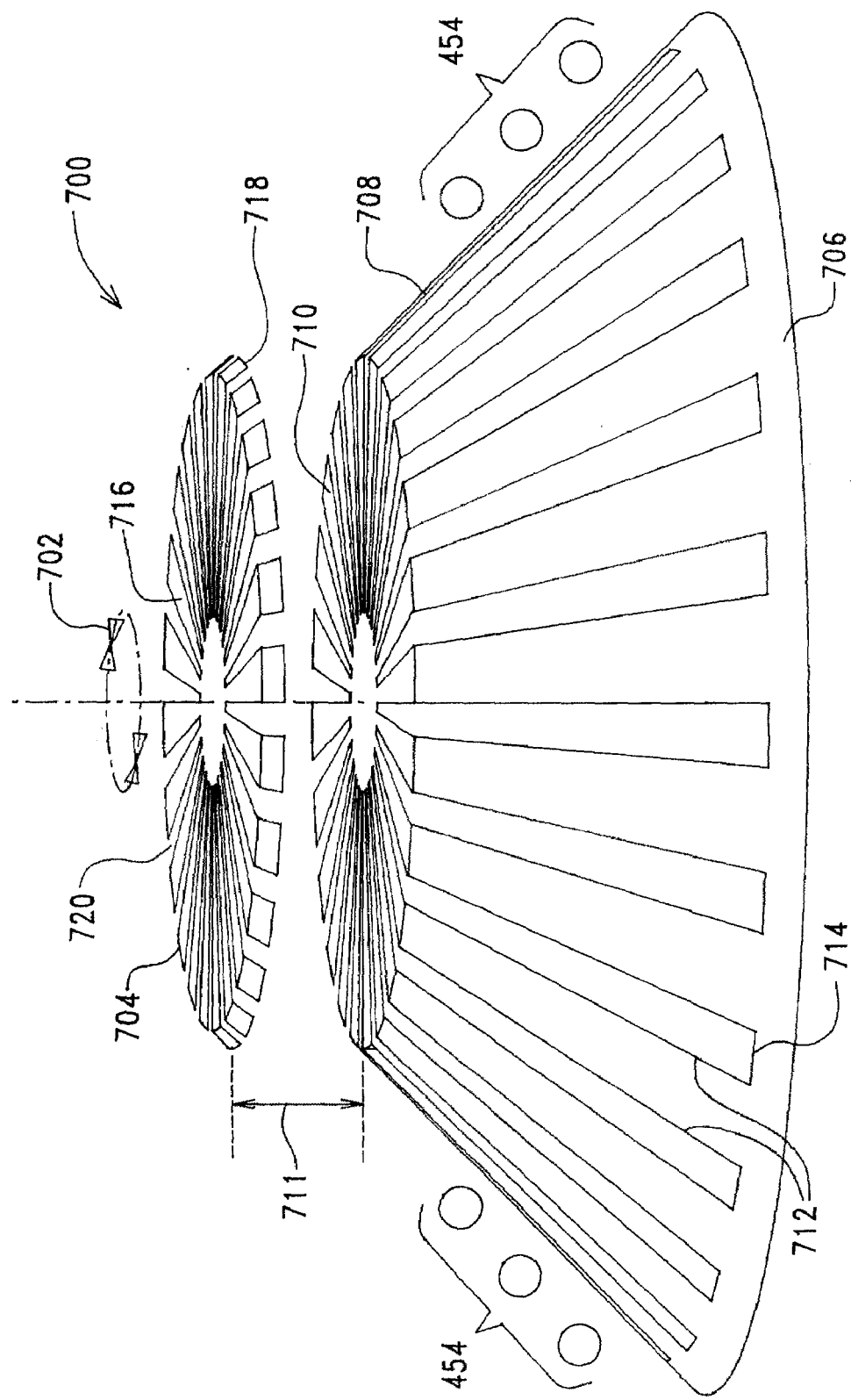
FIG. 11a is diagrammatic, perspective view of another two-part electrostatic shield assembly, shown here to illustrate the overall configuration of the assembly having a slotted frustoconical inner shield member and a slotted outer shield member configured to engage primarily a top portion of the inner shield member to vary RF magnetic field penetration with relative rotation between the inner and outer shield members.

FIG. 11a illustrates a modified form of the electrostatic shield embodiment shown in FIG. 10a, generally indicated by the reference number 700. This figure depicts a two part electrostatic shield assembly whereby the RF penetration into the associated plasma vessel (not shown) is controlled by rotation, illustrated by arrows 702, of a top portion 704 of a two-part electrostatic shield assembly. The assembly also includes a bottom portion 706 having a sidewall 708 defining an upper periphery and a top wall 710 which extends inward from and is contiguous with the upper periphery of sidewall 708. Induction coil 454 is diagrammatically shown and is arranged adjacent to sidewall 708. It is noted that top portion 704 is shown spaced away from bottom portion 706 for purposes of illustrative clarity and is to be moved to its operational position as indicated by an arrow 711. Sidewall 708 cooperates with top wall 710 to define a plurality of spaced apart slots 712 in bottom portion 706 of the shield assembly. In this example, however, each one of slots 712 is defined having a lowermost end 714 that is spaced away from a lowermost edge of the bottom part of the shield assembly. Slots 712 are continuous and extend into top wall 710 toward its center. Each slot 712 has an overall wedge-shaped configuration.

Still referring to FIG. 11a, top portion 704 of shield embodiment 700 includes a generally planar center plate-like member 716 and a peripheral downwardly extending rim 718. Top portion 704 defines a plurality of wedge-shaped slots 720 that are selectively, rotatably alignable with uppermost portions of slots 712 in the bottom portion of the shield assembly. This figure shows the top portion of the shield aligned to allow maximum RF field penetration. Again, the top shield portion is shown lifted away from the bottom portion only for the purpose of demonstrating the alignment of the slot patterns in both of the shield components.

Figure 11B:
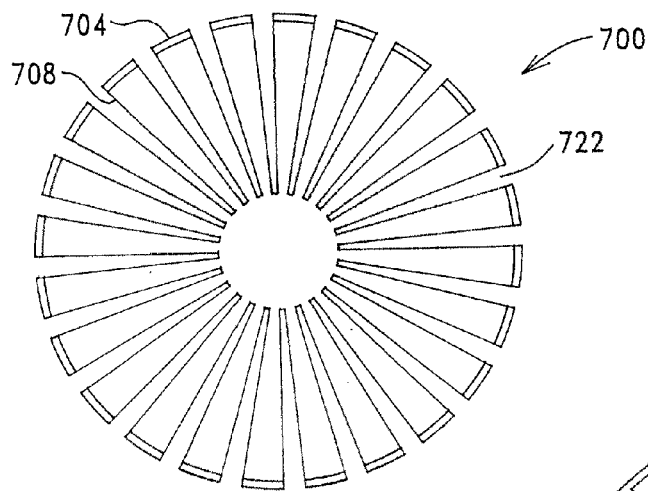
FIGS. 11b-11d are diagrammatic, plan views of the top portion of the shield assembly of FIG. 11a, shown here to illustrate a few of the various effective aperture configurations that can be achieved with relative rotation between the inner and outer shield members.
Figure 11C:
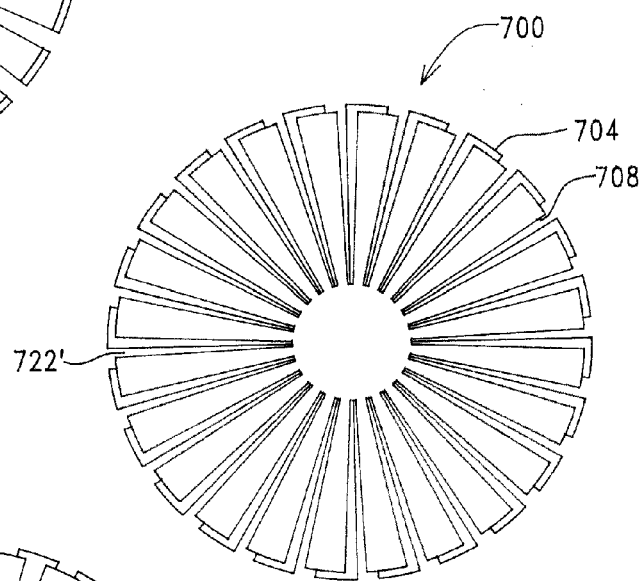
Figure 11D:
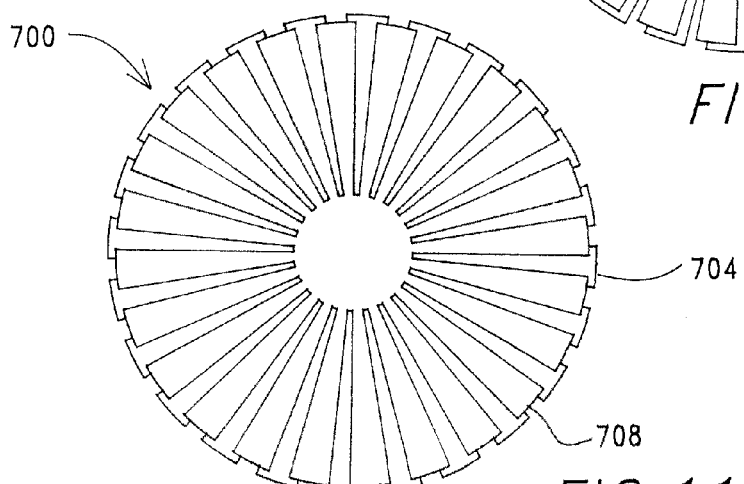

Turning to FIGS. 11b-d in conjunction with FIG. 11a, each of these figures comprises a diagrammatic plan view of shield assembly 700 having the top and bottom shield portions rotated into different relative positions. It is noted that only the uppermost planar portions of the shield members have been diagrammatically illustrated for purposes of simplicity. In FIG. 11b, slots 720 in the top shield portion are substantially aligned with slots 712 in the bottom shield portion. Therefore, the two parts of the shield assembly are aligned so as to completely open the slots on the top of the shield assembly, thereby defining relatively larger effective apertures 722 at the top of the overall assembly. In FIG. 11c, the two shield portions are arranged so as to partially close the slots on the top of the shield assembly, thereby reducing the relative size of the effective aperture, indicated as 722', at the top of the overall shield assembly. In FIG. 11d, the two shield portions are rotationally aligned so that the effective apertures on the top of the shield assembly are completely closed, thereby minimizing RF penetration into the center of the associated plasma vessel (not shown).

Figure 12A:
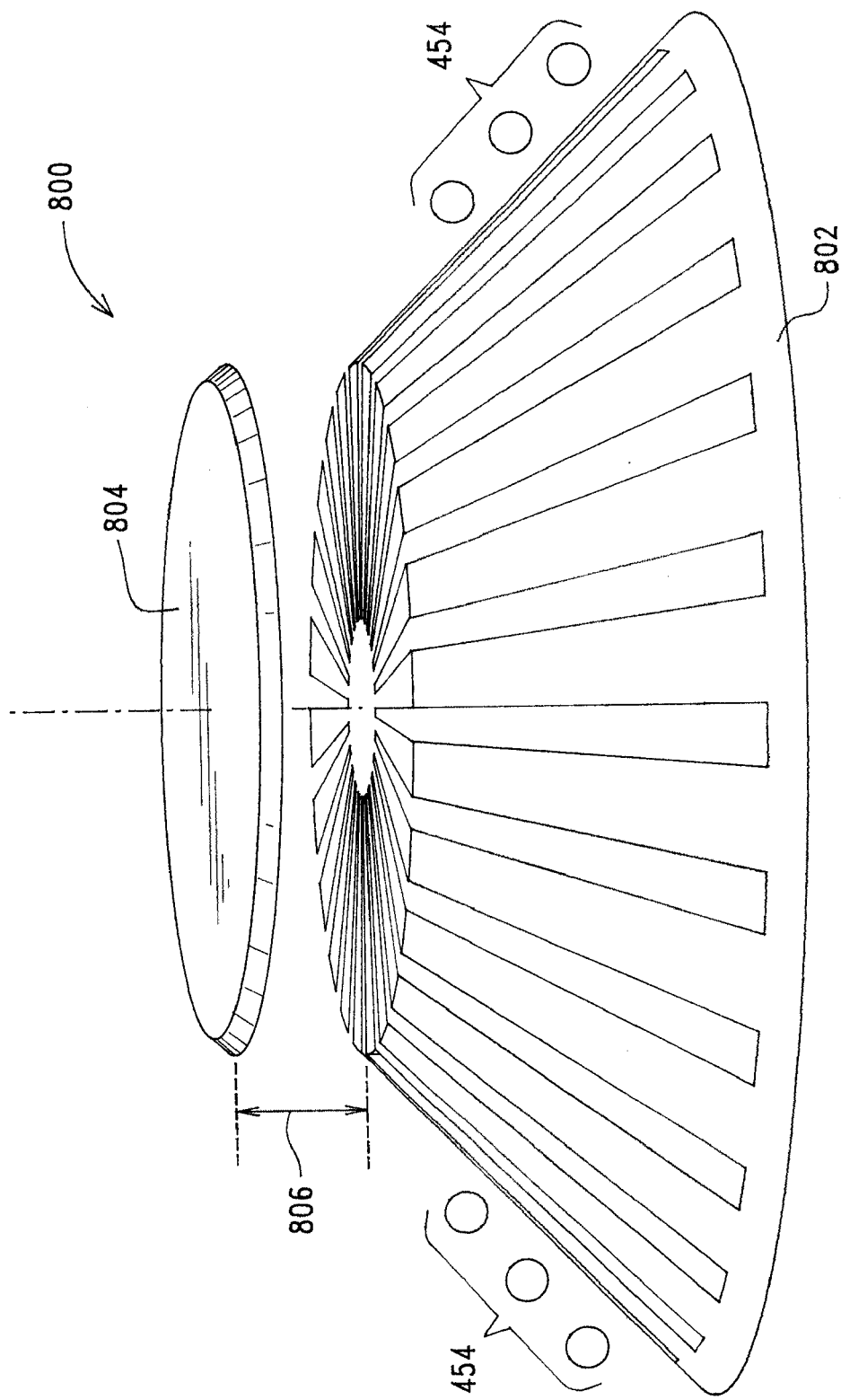
FIG. 12a is a diagrammatic, perspective view of a two-part electrostatic shield assembly having an inner shield resembling the inner shield of the assembly shown in FIG. 11a but with a magnetic control plate resembling the magnet control plate of the assembly shown in FIGS. 9a-9c and with the magnet control plate spaced apart from the inner shield to provide substantial RF magnetic field penetration.
Figure 12B:
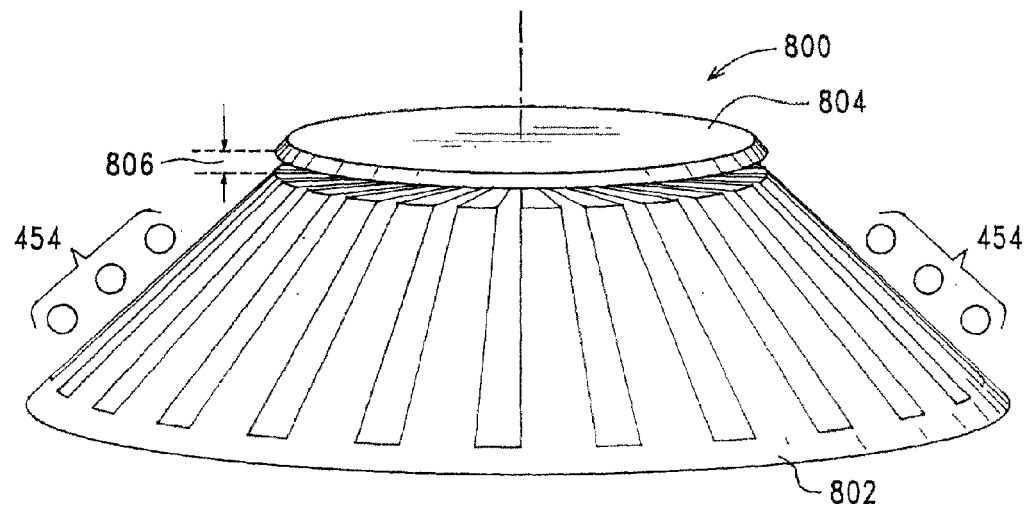
FIGS. 12b-12c are diagrammatic, perspective views of the two-part electrostatic shield assembly of FIG. 12a showing the magnetic control plate at an intermediate position with respect to the inner shield member and positioned on the inner shield member, respectively.
Figure 12C:
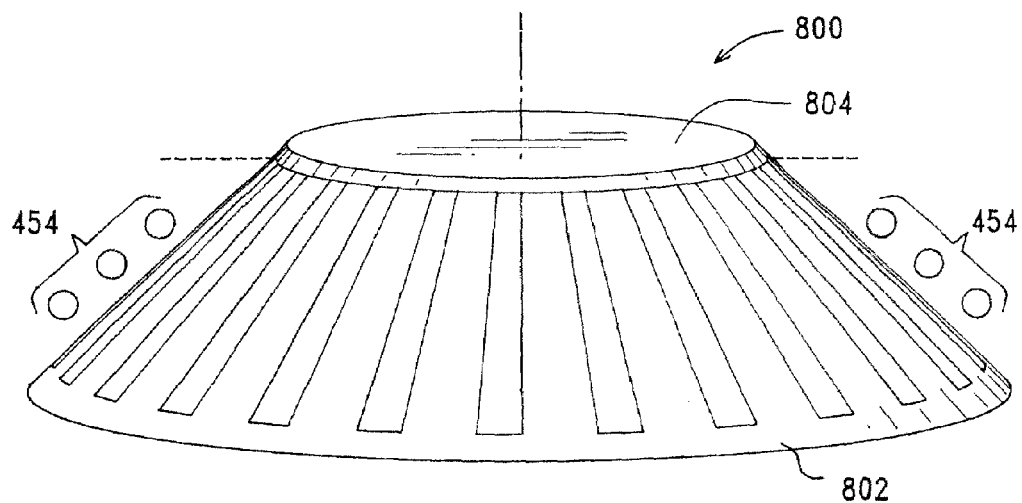

Referring to FIG. 12a, an electrostatic shield assembly, produced in accordance with the present invention, is generally indicated by the reference number 800. Assembly 800 resembles shield assembly 500 of FIGS. 9a-c with a few exceptions to which the present description will be limited for purposes of brevity. Specifically, shield assembly 800 includes a bottom shield portion 802 which is essentially the same as bottom shield portion 706 of FIGS. 11a-d. A magnetic control plate 804 is moved in the manner shown with respect to FIGS. 9a-c in a way which varies RF field penetration at the top of the shield assembly. This movement is indicated by a double-headed arrow 806. FIG. 12b shows control plate 804 at an intermediate position in relation to bottom shield portion 802 while FIG. 12c shows control plate 804 positioned on bottom shield portion 802.

While the present disclosure describes the modification of plasma density in terms of identifying areas of lower density and then increasing the plasma density in that area by increasing the effective shield aperture proximate to that area, it is considered to be equally effective to reduce the effective shield aperture proximate to areas having a higher plasma density. Either approach produces an identical conceptual result.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. Therefore, the present examples and methods are to be considered as illustrative and not restrictive, and the invention is not to be limited to the details given herein.

What is claimed is:

1. In a processing chamber that uses an inductively coupled plasma source defining an axis of symmetry which produces a plasma density having a given radial variation characteristic across a treatment surface of a treatment object therein using a given electrostatic shield, a method comprising:

configuring an electrostatic shield arrangement to replace said given electrostatic shield in a way which provides for producing a modified radial variation characteristic across said treatment surface which is different than said given radial variation characteristic and said electrostatic shield arrangement is further configured to include at least a sidewall arrangement having a shape that extends through a range of radii relative to said axis of symmetry having a modified slot arrangement that is made up of a plurality of elongated modified slots, each of which includes a length in said sidewall that extends through at least a portion of said range of radii and each of which includes a width that varies at least partially along said length for producing said modified radial variation characteristic.

2. The method of claim 1 including using the electrostatic shield arrangement to produce said modified radial variation characteristic as being more constant across said treatment surface than the given radial variation characteristic.

3. The method of claim 1 wherein said electrostatic shield arrangement is at least generally conical in configuration.

4. The method of claim 1 wherein said electrostatic shield arrangement is at least generally frustoconical in configuration.

5. The method of claim 1 wherein said electrostatic shield arrangement is at least generally dome-shaped in configuration.

6. The method of claim 1 wherein said electrostatic shield arrangement includes a plate-like upper surface that is arranged to intersect said axis of symmetry and each of said elongated modified slots extends from the sidewall and at least partially across said plate-like upper surface.

7. In a processing chamber that uses an inductively coupled plasma source that defines an axis of symmetry and which produces a plasma density having a given radial variation characteristic across a treatment surface of a treatment object therein using a given electrostatic shield, a method comprising:

configuring an electrostatic shield arrangement to include at least a sidewall arrangement having a shape that extends through a range of radii relative to said axis of symmetry to replace said given electrostatic shield to provide for producing a modified radial variation characteristic across said treatment surface which is different than said given radial variation characteristic by arranging said electrostatic shield arrangement to include at least a first, inner shield member and a second, outer shield member, said inner shield member defining a first aperture pattern and said outer shield member defining a second aperture pattern, and supporting the outer shield member outside of and adjacent to the inner shield member and rotating the outer shield member relative to the inner shield member to cause the first aperture pattern to cooperate with the second aperture pattern in a way which provides a range in said modified radial variation characteristic across said treatment surface.

8. The method of claim 7 including a rotation arrangement for sensing the modified radial variation characteristic and for rotating one of the inner shield member and the outer shield member responsive to a sensed value of the modified radial variation characteristic.

9. The method of claim 7 wherein said electrostatic shield arrangement is configured such that each of the inner shield member and the outer shield member are frustoconical in configuration, said inner shield member including an inner shield sidewall and said outer shield member including an outer shield sidewall such that the inner shield sidewall and the outer shield sidewall are adjacent to one another.

10. In a processing chamber that uses an inductively coupled plasma source that defines an axis of symmetry and which produces a plasma density having a given radial variation characteristic across a treatment surface of a treatment object therein using a given electrostatic shield, a method comprising:

configuring an electrostatic shield arrangement to include at least a sidewall arrangement having a shape that extends through a range of radii relative to said axis of symmetry to replace said given electrostatic shield to provide for producing a modified radial variation characteristic across said treatment surface which is different than said given radial variation characteristic by arranging said electrostatic shield arrangement to include at least a first shield member and a second shield member, said first shield member defining a first aperture pattern, and supporting said second shield member outside the first shield member for linear movement in relation to the first shield member in a way which produces a range in said modified radial variation characteristic across said treatment surface.

11. The method of claim 10 wherein said first shield member is frustoconical in configuration having a narrowed end and said second shield member is supported for movement toward and away from the narrowed end of the first shield member.

12. The method of claim 11 including forming said narrowed end having a through opening and said second shield member moves toward and away from said through opening.

13. The method of claim 11 wherein the frustoconical configuration of the first shield member includes a conical sidewall having an upper peripheral edge and a top wall having an outer peripheral edge that is connected with the upper peripheral edge of the conical sidewall.

14. The method of claim 13 wherein said conical sidewall and said top wall cooperate to define an overall aperture pattern that carries in a continuous manner from the conical sidewall to the top wall.

15. The method of claim 14 including forming said overall aperture pattern as a circumferential arrangement of wedge-shaped apertures each defined as having a base edge in the conical sidewall and an apex in said top wall.

16. In a processing chamber that uses an inductively coupled plasma source that defines an axis of symmetry and which produces a plasma density having a given radial variation characteristic across a treatment surface of a treatment object therein using a given electrostatic shield, a method comprising:

configuring an electrostatic shield arrangement to include at least a sidewall arrangement having a shape that extends through a range of radii relative to said axis of symmetry to replace said given electrostatic shield in a way which provides for producing a modified radial variation characteristic across said treatment surface which is different than said given radial variation characteristic by arranging said electrostatic shield arrangement to include at least a first shield member and a second shield member, said first shield member defining a first aperture pattern and said second shield member defining a second aperture pattern, and supporting said second shield member outside the first shield member for rotational movement about said axis of symmetry and in relation to the first shield member in a way which produces a range in said modified radial variation characteristic across said treatment surface by rotating the second shield member relative to the first shield member.

17. The method of claim 16 wherein said first shield member is frustoconical in configuration having a conical sidewall and a narrowed end that is closed by an upper surface, and said conical sidewall and said upper surface cooperate to define said first aperture pattern as a plurality of spaced apart openings that carry in a continuous manner from the conical sidewall into the upper surface, and said second shield member is formed to include a major surface that is arranged in a confronting relationship with said upper surface of the first shield member, said major surface defining a plurality of slots, as the second aperture pattern, complementing said spaced apart openings, as defined in the upper surface of the first shield member, and arranging the second shield member for rotation about said axis of symmetry such that rotation of the second shield member relative to the first shield member modifies said radial variation characteristic.

18. The method of claim 17 wherein said spaced apart openings of the first aperture pattern and said slots of the second aperture pattern are each configured as wedge-shaped such that each of the openings in the first shield member includes a base edge in the conical sidewall and an apex in said upper surface.

19. The method of claim 17 including forming said second shield member to include a skirt that extends from an outermost edge of said major surface in a confronting relationship with said conical sidewall of the first shield member and at least a portion of said second aperture pattern is defined in said skirt.

20. The method of claim 1 including using a semiconductor wafer as said treatment object.

* * * * *